(12) United States Patent
Hizu

(10) Patent No.: US 12,192,657 B2
(45) Date of Patent: Jan. 7, 2025

(54) SOLID-STATE IMAGE SENSOR AND IMAGING DEVICE

(71) Applicant: Sony Semiconductor Solutions Corporation, Kanagawa (JP)

(72) Inventor: Kazuki Hizu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 113 days.

(21) Appl. No.: 18/020,733

(22) PCT Filed: Aug. 4, 2021

(86) PCT No.: PCT/JP2021/028874
§ 371 (c)(1),
(2) Date: Feb. 10, 2023

(87) PCT Pub. No.: WO2022/064867
PCT Pub. Date: Mar. 31, 2022

(65) Prior Publication Data
US 2023/0300494 A1   Sep. 21, 2023

(30) Foreign Application Priority Data
Sep. 28, 2020   (JP) .................................. 2020-161662

(51) Int. Cl.
*H04N 25/77* (2023.01)
*G01J 1/00* (2006.01)
(Continued)

(52) U.S. Cl.
CPC ....... *H04N 25/77* (2023.01); *H01L 27/14634* (2013.01); *H04N 25/709* (2023.01)

(58) Field of Classification Search
CPC .... H04N 25/77; H04N 25/709; H04N 25/773; H04N 25/79; H04N 25/131;
(Continued)

(56) References Cited

U.S. PATENT DOCUMENTS

| 11,818,483 B2* | 11/2023 | Sasago | H04N 25/709 |
| 2018/0189827 A1* | 7/2018 | Haraguchi | H04N 25/68 |

(Continued)

FOREIGN PATENT DOCUMENTS

| JP | 2019075610 A | 5/2019 |
| JP | 2019192903 A | 10/2019 |
| JP | 2020127122 A | 8/2020 |

OTHER PUBLICATIONS

International Search Report (PCT/ISA/210), International Application No. PCT/JP2021/028874, dated Oct. 26, 2021.

*Primary Examiner* — Marly S Camargo
(74) *Attorney, Agent, or Firm* — Michael Best & Friedrich LLP

(57) ABSTRACT

Improved is performance of a solid-state image sensor that detects presence or absence of a photon.
The solid-state image sensor includes a light-receiving substrate and a logic substrate. In the solid-state image sensor, there is disposed, on the light-receiving substrate, a plurality of avalanche photodiodes, each of the avalanche photodiodes generating a current corresponding to incident of a photon. Furthermore, in the solid-state image sensor, there is disposed, on the logic substrate, a counter that counts the number of photons on the basis of a current of a selected avalanche photodiode among the plurality of avalanche photodiodes.

20 Claims, 22 Drawing Sheets

(51) Int. Cl.
*G01J 1/14* (2006.01)
*H01L 27/146* (2006.01)
*H04N 25/131* (2023.01)
*H04N 25/133* (2023.01)
*H04N 25/709* (2023.01)
*H04N 25/773* (2023.01)
*H04N 25/79* (2023.01)

(58) Field of Classification Search
CPC .. H04N 25/133; H04N 25/134; H04N 25/135; H01L 27/14634; H01L 31/10; H01L 31/107; G01J 1/00; G01J 1/42
See application file for complete search history.

(56) References Cited

U.S. PATENT DOCUMENTS

| | | | |
|---|---|---|---|
| 2019/0326450 A1* | 10/2019 | Iwata | H01L 31/02027 |
| 2020/0314375 A1* | 10/2020 | Nishino | H04N 25/50 |
| 2021/0123802 A1* | 4/2021 | Ryoki | G01J 1/44 |
| 2022/0344521 A1* | 10/2022 | Luo | G01J 1/44 |
| 2023/0120430 A1* | 4/2023 | Ota | H04N 25/773 |
| 2024/0240984 A1* | 7/2024 | Kikuchi | G01J 1/44 |

* cited by examiner

SOLID-STATE IMAGE SENSOR AND IMAGING DEVICE

TECHNICAL FIELD

The present technology relates to a solid-state image sensor. Specifically, the present technology relates to a solid-state image sensor that counts the number of photons, and an imaging device.

BACKGROUND ART

Conventionally, in a case where it is necessary to detect presence or absence of a photon in an imaging device, a distance measurement module, or the like, a single-photon avalanche diode (SPAD) is used. For example, there has been proposed a solid-state image sensor provided with a plurality of SPADs, an inverter, and a plurality of switch elements that selects at least one of the plurality of SPADs and connects the SPAD to the inverter (refer to Patent Document 1, for example). In the solid-state image sensor, circuits at and after the inverter are shared by a plurality of SPADs.

CITATION LIST

Patent Document

Patent Document 1: Japanese Patent Application Laid-Open No. 2019-192903

SUMMARY OF THE INVENTION

Problems to be Solved by the Invention

In the above-described conventional technology, a circuit scale is reduced by sharing the circuits at and after the inverter by the plurality of SPADs. However, in the above-described solid-state image sensor, it is difficult to further improve performance of pixel density, power saving, or the like. For example, when a circuit for operation at a low voltage is added for a purpose of improving power saving, there arises a problem that the circuit scale increases. Furthermore, for example, when a light receiving area of each pixel is reduced for a purpose of improving the pixel density, there arises a problem that sensitivity decreases.

The present technology has been developed in view of such a situation, and an object thereof is to improve performance of a solid-state image sensor that detects presence or absence of a photon.

Solutions to Problems

The present technology has been made to solve the above-described problems, and a first aspect of the present technology is a solid-state image sensor including a light-receiving substrate on which a plurality of avalanche photodiodes is disposed, each of the avalanche photodiodes generating a current corresponding to incident of a photon, and a logic substrate on which a counter is disposed, the counter counting the number of the photons on the basis of the current of a selected avalanche photodiode among the plurality of avalanche photodiodes. This produces an effect that a circuit scale for each substrate is reduced.

Furthermore, in the first aspect, the plurality of avalanche photodiodes may include first and second avalanche photodiodes, and there may be further disposed, on the logic substrate, a detection circuit that generates a pulse signal on the basis of a voltage according to the current and outputs the pulse signal to the counter, a first selection transistor that opens and closes a path between one end of the first avalanche photodiode and the detection circuit, a second selection transistor that opens and closes a path between one end of the second avalanche photodiode and the detection circuit, and a control circuit that controls voltage of each gate of the first and second selection transistors. This produces an effect that a pixel is selected or added.

Furthermore, in the first aspect, in a case where at least one of the first and second selection transistors is in a closed state, the control circuit may supply the gate with a voltage higher than a difference between a potential of the one end after a potential drop due to the photon and each threshold voltage of the first and second selection transistors. This produces an effect that amplitude of a pulse signal is limited.

Furthermore, in the first aspect, the counter may include first and second counters, the detection circuit may include a first detection circuit that generates a first pulse signal and supplies the first pulse signal to the first counter, and a second detection circuit that generates a second pulse signal and supplies the second pulse signal to the second counter, the first selection transistor may open and close a path between one end of the first avalanche photodiode and the first detection circuit, the second selection transistor may open and close a path between one end of the second avalanche photodiode and the second detection circuit, there may be further disposed, on the logic substrate, a third selection transistor that opens and closes a path between one end of the first avalanche photodiode and the second detection circuit, and a fourth selection transistor that opens and closes a path between one end of the second avalanche photodiode and the second detection circuit, and the control circuit may further control voltage of each gate of the third and fourth selection transistors. This produces an effect that a plurality of pieces of pixel data is generated for each share block.

Furthermore, in the first aspect, the control circuit may include an on-state voltage generation unit that generates a voltage according to a predetermined reference voltage as an on-state voltage, and a selector that selects either an off-state voltage different from the on-state voltage or the on-state voltage, and supplies the selected voltage to the gate. This produces an effect that the on-state voltage is adjusted.

Furthermore, in the first aspect, the detection circuit may include a first detection circuit that generates a first pulse signal and a second detection circuit that generates a second pulse signal, the first selection transistor may open and close a path between one end of the first avalanche photodiode and the first detection circuit, the second selection transistor may open and close a path between one end of the second avalanche photodiode and the second detection circuit, and there may be further disposed, on the logic substrate, a first pulse-shaping circuit that shortens a pulse width of the first pulse signal, a second pulse-shaping circuit that shortens a pulse width of the second pulse signal, and a logical OR gate that supplies the counter with a logical OR of the first and second pulse signals having shortened pulse widths. This produces an effect that errors in a count value decreases.

Furthermore, in the first aspect, there may be further disposed, on the logic substrate, a clip transistor that fixes a potential of the one end to a predetermined value. This produces an effect that a potential at one end of the avalanche photodiodes is fixed.

Furthermore, in the first aspect, the plurality of avalanche photodiodes may include first and second avalanche photodiodes, there may be further disposed, on the logic substrate, a detection circuit that generates a pulse signal on the basis of a voltage according to the current and outputs the pulse signal to the counter, and there may be further disposed, on the light-receiving substrate, a first selection transistor that opens and closes a path between one end of the first avalanche photodiode and the detection circuit, a second selection transistor that opens and closes a path between one end of the second avalanche photodiode and the detection circuit, and a clip transistor that fixes a potential of the one end to a predetermined value. This produces an effect that a potential at one end of the avalanche photodiodes is fixed.

Furthermore, in the first aspect, there may be further disposed, on the light-receiving substrate, a first resistor that is inserted between one end of the first avalanche photodiode and the first selection transistor, and a second resistor that is inserted between one end of the second avalanche photodiode and the second selection transistor. This produces an effect that power consumption decreases.

Furthermore, in the first aspect, an intermediate substrate is further included, in which the plurality of avalanche photodiodes may include first and second avalanche photodiodes, and there may be further disposed, on the intermediate substrate, a first selection transistor that opens and closes a path between one end of the first avalanche photodiode and a common node, and a second selection transistor that opens and closes a path between one end of the second avalanche photodiode and the common node. This produces an effect that a circuit scale for each substrate is reduced.

Furthermore, in the first aspect, there may be further disposed, on the logic substrate, a detection circuit that generates a pulse signal on the basis of a potential of the common node and outputs the pulse signal to the counter, and there may be further disposed, on the intermediate substrate, a clip transistor that fixes a potential of the one end to a predetermined value. This produces an effect that a potential at one end of the avalanche photodiodes is fixed.

Furthermore, in the first aspect, there may be further disposed, on the intermediate substrate, a detection circuit that generates a pulse signal on the basis of a potential of the common node and outputs the pulse signal to the counter.

Furthermore, in the first aspect, there may be further disposed, on the light-receiving substrate, a first resistor that is inserted between one end of the first avalanche photodiode and the first selection transistor, and a second resistor that is inserted between one end of the second avalanche photodiode and the second selection transistor. This produces an effect that power consumption is reduced.

Furthermore, in the first aspect, there may be further disposed, on the logic substrate, a detection circuit that generates a pulse signal on the basis of a potential of the common node and outputs the pulse signal to the counter. This produces an effect that a circuit scale of the intermediate substrate is reduced.

Furthermore, in the first aspect, there may be further disposed, on the intermediate substrate, a detection circuit that generates a pulse signal on the basis of a potential of the common node and outputs the pulse signal to the counter. This produces an effect that a circuit scale of the logic substrate is reduced.

Furthermore, a second aspect of the present technology is an imaging device including a light-receiving substrate on which a plurality of avalanche photodiodes is disposed, each of the avalanche photodiodes generating a current corresponding to incident of a photon, a logic substrate on which a counter is disposed, the counter counting the number of the photons on the basis of the current of a selected avalanche photodiode among the plurality of avalanche photodiodes, and a recording unit that records a digital signal that indicates a count value of the counter. This produces an effect that a circuit scale for each substrate in the imaging device is reduced.

MODE FOR CARRYING OUT THE INVENTION

Modes for carrying out the present technology (hereinafter, referred to as embodiments) will be described below. The description will be made in the following order.

Figure 1:
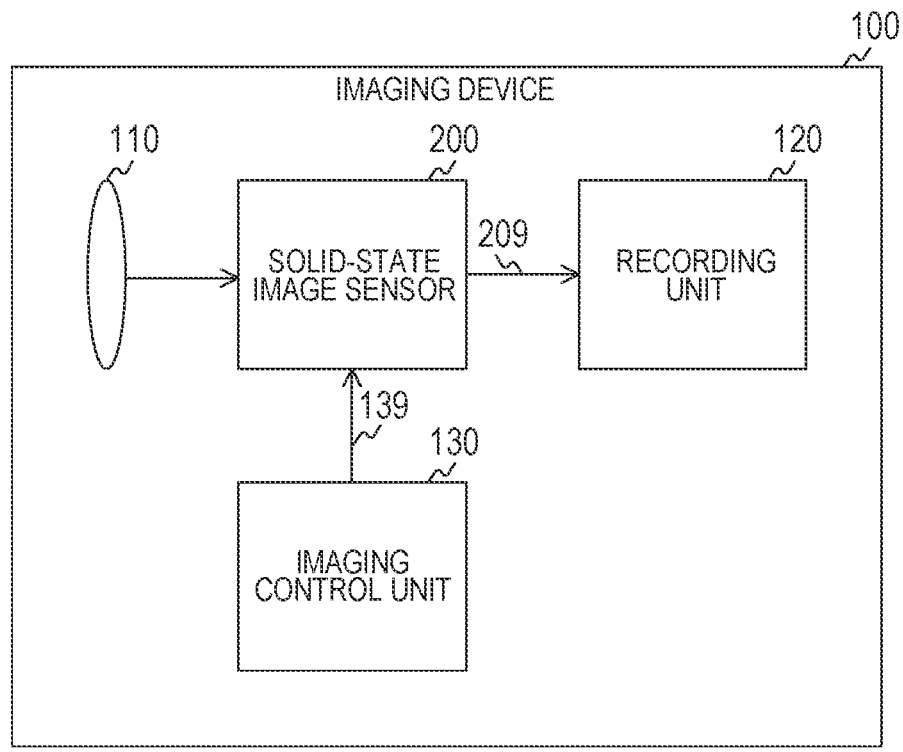
FIG. 1 is a block diagram illustrating a configuration example of an imaging device according to a first embodiment of the present technology.

1. First embodiment (Example of reducing amplitude of potential of common node)
2. Second embodiment (Example of adding counter to reduce amplitude of potential at common node)
3. Third embodiment (Example of adjusting on-state voltage to reduce amplitude of potential at common node)
4. Fourth embodiment (Example of shortening pulse width to reduce amplitude of potential at common node)
5. Fifth embodiment (Example of clipping potential of cathode to reduce amplitude of potential at common node)
6. Sixth embodiment (Example of stacking three substrates to reduce amplitude of potential at common node)
7. Example of application to mobile object 1. First Embodiment Configuration Example of Imaging Device FIG. 1 is a block diagram illustrating a configuration example of an imaging device 100 according to an embodiment of the present technology. The imaging device 100 captures image data, and includes an imaging lens 110, a solid-state image sensor 200, a recording unit 120, and an imaging control unit 130. As the imaging device 100, for example, a smartphone, a digital camera, a personal computer, a vehicle-mounted camera, or an Internet of Things (IoT) camera is assumed.

The imaging lens 110 condenses incident light and guides the light to the solid-state image sensor 200. The solid-state image sensor 200 captures the image data under control of the imaging control unit 130. The solid-state image sensor 200 supplies the captured image data to the recording unit 120 via a signal line 209. The recording unit 120 records image data.

The imaging control unit 130 controls the solid-state image sensor 200 to capture the image data. The imaging control unit 130 supplies the solid-state image sensor 200 with, for example, a synchronization signal such as a vertical synchronization signal via a signal line 139.

Note that the imaging device 100 may further include an interface and transmit the image data to outside via the interface, or may further include a display unit and display the image data on the display unit.

Configuration Example of Solid-State Image Sensor

Figure 2:
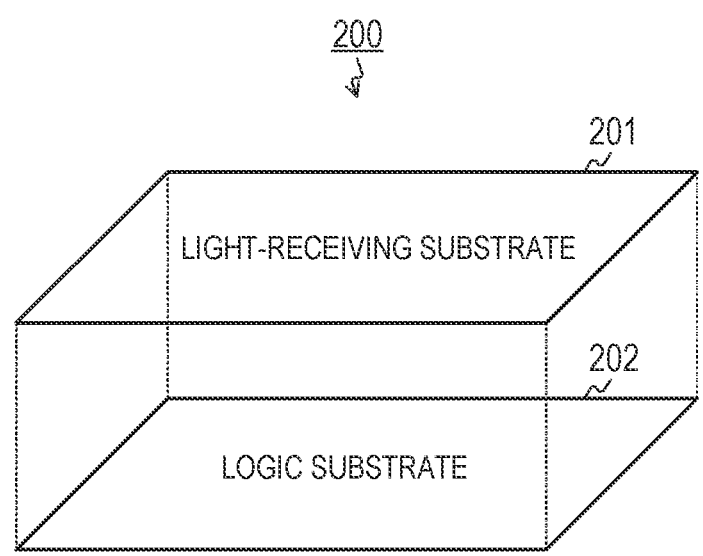
FIG. 2 is a diagram illustrating an example of a stacked structure of a solid-state image sensor according to the first embodiment of the present technology.

FIG. 2 is a diagram illustrating an example of a stacked structure of the solid-state image sensor 200 according to an embodiment of the present technology. The solid-state image sensor 200 includes a light-receiving substrate 201, and a logic substrate 202 on which the light-receiving substrate 201 is stacked. These substrates are electrically connected by Cu—Cu bonding or the like. Note that, in addition to the Cu—Cu bonding, connection can be made by a via hole or a bump.

Figure 3:
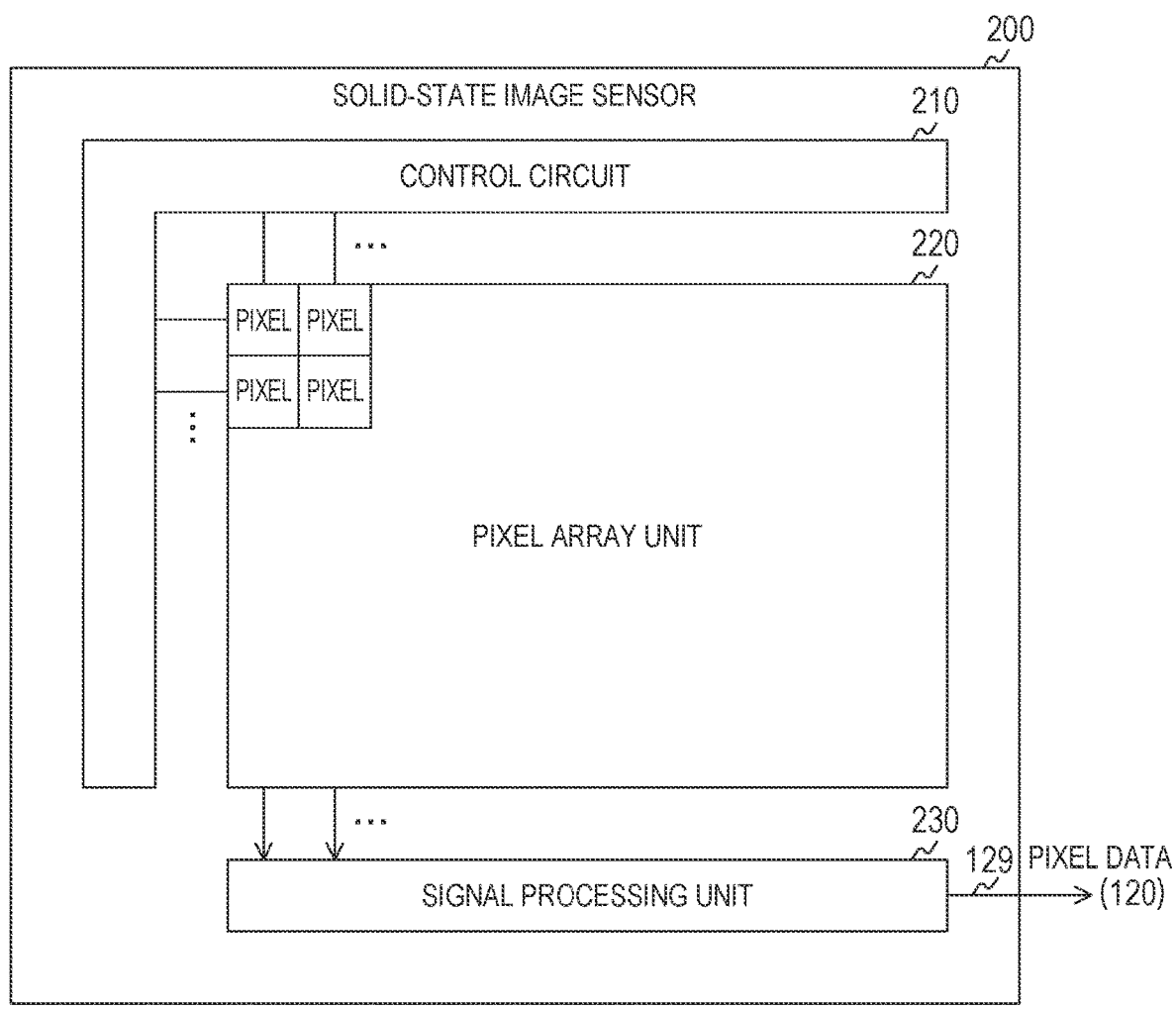
FIG. 3 is a block diagram illustrating a configuration example of the solid-state image sensor according to the first embodiment of the present technology.

FIG. 3 is a block diagram illustrating a configuration example of the solid-state image sensor 200 according to the first embodiment of the present technology. The solid-state image sensor 200 includes a control circuit 210, a pixel array unit 220, and a signal processing unit 230. In the pixel array unit 220, a plurality of pixels is arranged in a two-dimensional lattice pattern.

The control circuit 210 selects at least one pixel and drives the pixel. With photoelectric conversion, the selected pixel generates a digital signal as pixel data, and supplies the pixel data to the signal processing unit 230.

The signal processing unit 230 executes predetermined signal processing such as filter processing on the image data in which the pixel data are arranged. The signal processing unit 230 outputs the processed image data to the recording unit 120.

Configuration Examples of Pixel Array Unit

Figure 4:
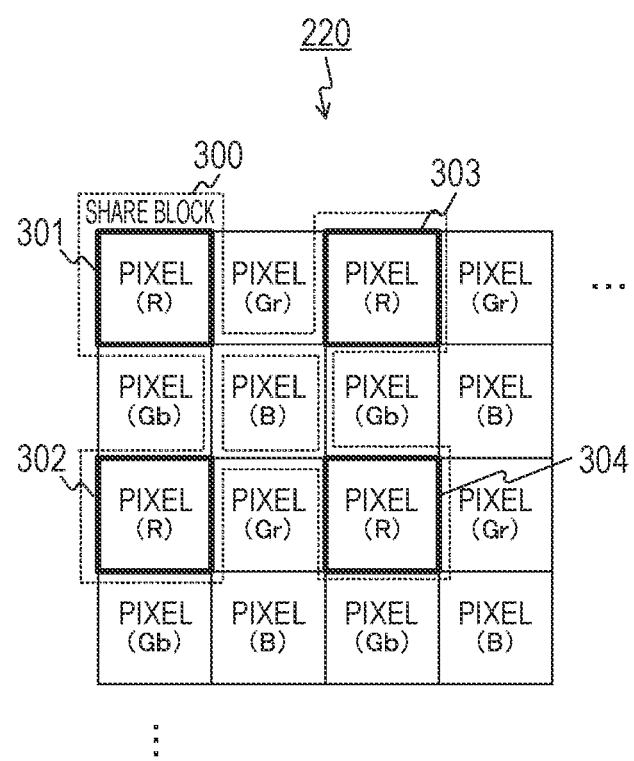
FIG. 4 is a plan view illustrating a configuration example of a pixel array unit according to the first embodiment of the present technology.

FIG. 4 is a plan view illustrating a configuration example of the pixel array unit 220 according to the first embodiment of the present technology. In the pixel array unit 220, a plurality of pixels, such as pixels 301 to 304, is arranged in a two-dimensional lattice pattern. Each of the pixels receives any of red (R), green (G), or blue (B) visible light with an on-chip color filter and performs photoelectric conversion. These pixels are arranged in a Bayer array, for example. In the figure, "Gr" and "Gb" are pixels that receive green light. Note that colors of visible light to be received are not limited to R, G, and B, and may be R, G, B, and W (white), or the like. Furthermore, at least some of the pixels can receive invisible light such as infrared light, instead of visible light.

Furthermore, a plurality of adjacent pixels having the same color shares a counter (not illustrated). Here, "adjacent" means that an Euclidean distance between the pixels is within a predetermined distance. For example, the pixels 301 to 304 receive red light and share a counter. Hereinafter, a pixel group sharing a counter is referred to as a "share block 300".

Note that, although there are four pixels in the share block 300, the configuration is not limited thereto. The number of pixels in the share block 300 may be other than four (two pixels or the like).

Figure 5:
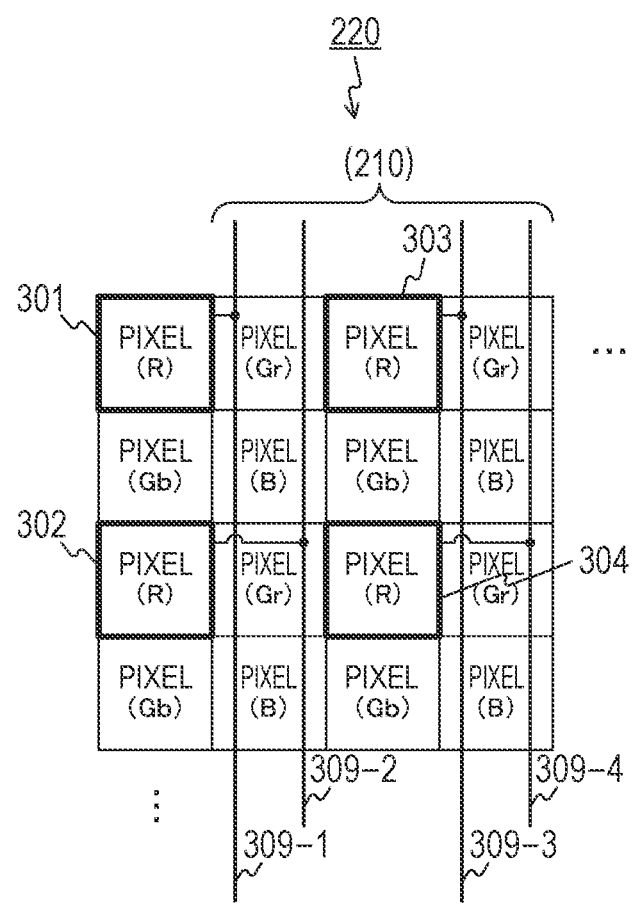
FIG. 5 is a plan view illustrating a wiring example of selection lines according to the first embodiment of the present technology.

FIG. 5 is a plan view illustrating a wiring example of selection lines according to the first embodiment of the present technology. In the pixel array unit 220, a selection line for transmitting a signal for selecting a pixel in a block is wired for each pixel. For example, in a certain share block 300, selection lines 309-1, 309-2, 309-3, and 309-4 are wired in a column direction. The selection line 309-1 connects the control circuit 210 and the pixel 301, and the selection line 309-2 connects the control circuit 210 and the pixel 302. The selection line 309-3 connects the control circuit 210 and the pixel 303, and the selection line 309-4 connects the control circuit 210 and the pixel 304.

Figure 6:
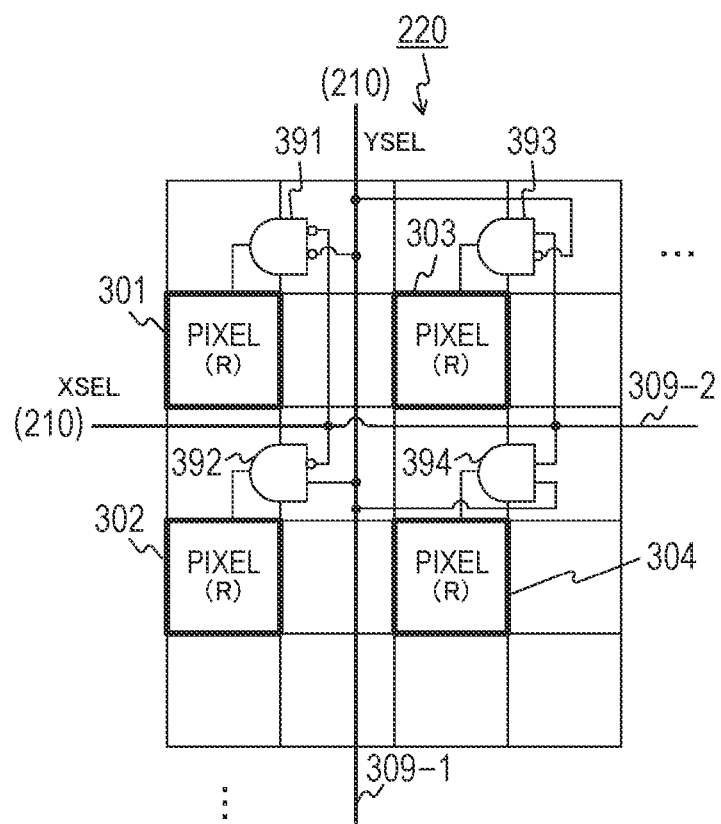
FIG. 6 is a plan view illustrating another wiring example of selection lines according to the first embodiment of the present technology.

Note that, although the selection line 309-1 and the like are wired in the column direction, each selection line may be wired in a row direction. Furthermore, a selection line wired in the row direction and a selection line wired in the column direction can be mixed. Furthermore, as exemplified in FIG. 6, the selection line 309-1 may be wired in the column direction, the selection line 309-2 may be wired in the row direction, and a logic gate may be added for each pixel. For example, a logic gate 391 is added to the pixel 301, and a logic gate 392 is added to the pixel 302. A logic gate 393 is added to the pixel 303, and a logic gate 394 is added to the pixel 304. The control circuit 210 supplies selection signals YSEL and XSEL via the selection lines 309-1 and 309-1. The logic gate 391 outputs a logical AND of respective inverted values of the selection signals YSEL and XSEL, and the logic gate 392 outputs a logical AND of the selection signal YSEL and the inverted value of the selection signal XSEL. The logic gate 393 outputs a logical AND of the inverted value of the selection signal YSEL and the selection signal XSEL, and the logic gate 394 outputs a logical AND of the selection signals YSEL and XSEL. With this configuration, the number of wiring of selection lines can be reduced as compared with FIG. 5.

Configuration Example of Share Block

Figure 7:
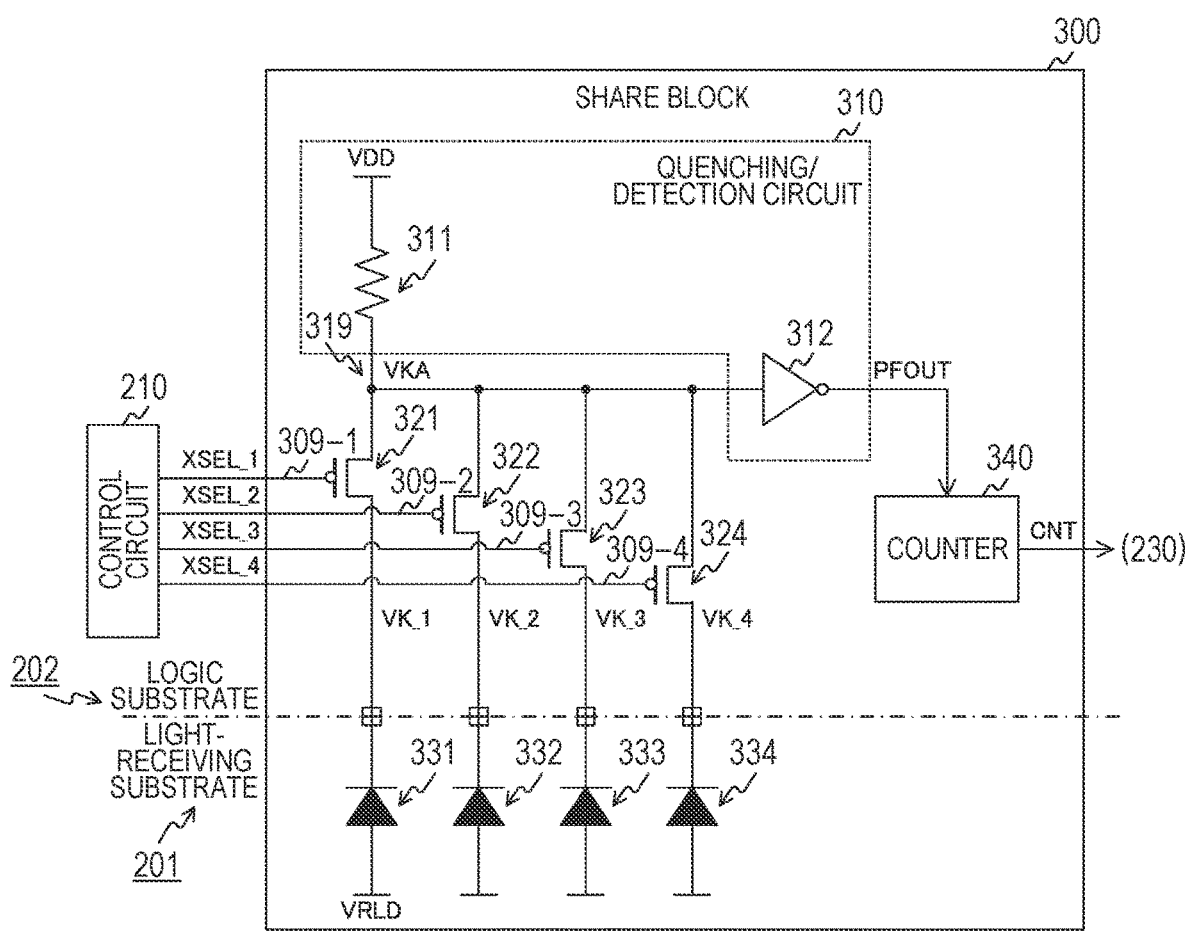
FIG. 7 is a circuit diagram illustrating a configuration example of a share block according to the first embodiment of the present technology.

FIG. 7 is a circuit diagram illustrating a configuration example of the share block 300 according to the first embodiment of the present technology. The share block 300 includes a quenching/detection circuit 310, selection transistors 321 to 324, SPADs 331 to 334, and a counter 340. The quenching/detection circuit 310 includes a resistor 311 and an inverter 312. In a wiring example in FIG. 5, for example, p-channel metal oxide semiconductor (pMOS) transistors are used as the selection transistors 321 to 324. Note that, in a wiring example in FIG. 6, for example, nMOS transistors are used as the selection transistors 321 to 324. Furthermore, output terminals of the respective logic gates 391 to 394 are input to gates of selection transistors of the corresponding pixels.

A circuit including the SPAD 331, the selection transistor 321, the quenching/detection circuit 310, and the counter 340 functions as the pixel 301. Furthermore, a circuit including the SPAD 332, the selection transistor 322, the quenching/detection circuit 310, and the counter 340 functions as the pixel 302. A circuit including the SPAD 333, the selection transistor 323, the quenching/detection circuit 310, and the counter 340 functions as the pixel 303. A circuit including the SPAD 334, the selection transistor 324, the quenching/detection circuit 310, and the counter 340 functions as the pixel 304.

Each of the SPADs 331 to 334 photoelectrically converts photons for avalanche multiplication to generate current. A negative bias VRLD is applied to anodes of the SPADs 331 to 334. A cathode of the SPAD 331 is connected to a drain of the selection transistor 321, and a cathode of the SPAD 332 is connected to a drain of the selection transistor 322. Furthermore, a cathode of the SPAD 333 is connected to a drain of the selection transistor 323, and a cathode of the SPAD 334 is connected to a drain of the selection transistor 324. Note that the SPADs 331 and 332 are examples of first and second avalanche photodiodes described in the claims.

Respective sources of the selection transistors 321 to 324 are commonly connected to a common node 319. Furthermore, a selection signal XSEL_1 from the control circuit 210 is input to a gate of the selection transistor 321 via the selection line 309-1. A selection signal XSEL_2 from the control circuit 210 is input to a gate of the selection transistor 322 via the selection line 309-2. A selection signal XSEL_3 from the control circuit 210 is input to a gate of the selection transistor 323 via the selection line 309-3. A selection signal XSEL_4 from the control circuit 210 is input to a gate of the selection transistor 324 via the selection line 309-4. Note that the selection transistors 321 and 322 are examples of first and second selection transistors described in the claims.

The resistor 311 is inserted between a node of a predetermined power-supply voltage VDU and the common node 319. The inverter 312 generates a pulse signal PFOUT on the basis of a potential of the common node 319 and supplies the pulse signal PFOUT to the counter 340. Note that the quenching/detection circuit 310 is an example of a detection circuit described in the claims.

The counter 340 counts the number of photons on the basis of the pulse signal PFOUT. The counter 340 counts the number of pulses of the pulse signal PFOUT as a value corresponding to the number of photons, and supplies the signal processing unit 230 with pixel data CNT indicating the count value.

Furthermore, the SPADs 331 to 334 are disposed on the light-receiving substrate 201, and remaining elements and circuits (such as the counter 340) are disposed on the logic substrate 202. By disposing elements and circuits on a plurality of substrates in a distributed manner, a circuit scale for each substrate can be reduced. With this arrangement, improvement of in pixel density is facilitated.

With the above-described connection configuration, a reverse bias having an absolute value higher than a breakdown voltage is applied between the anodes and cathodes of the SPADs 331 to 334. A difference between the reverse bias and the breakdown voltage is called an excess bias. Cathode potentials of the SPADs 331 to 334 are assumed to be VK_1 to VK_4. At a time of incidence of a photon, the cathode potentials VK_1 to VK_4 drop by the excess bias.

Furthermore, each of the selection transistors 321 to 324 shifts to an on-state or to an off-state according to each of the selection signals XSEL_1 to XSEL_4, and opens and closes a path between each of the SPADs 331 to 334 and the common node 319.

At a time of imaging, the control circuit 210 selects at least one of the four pixels, supplies a low-level selection signal to a selection transistor in the selected pixel, and supplies a high-level selection signal to a selection transistor in an unselected pixel. The selection transistor 321 and the like shift to a closed state according to the low-level selection signal, and the selection transistor 321 and the like shift to an open state by the high-level selection signal.

In a case where at least one of the selection transistors 321 to 324 is in the closed state, the potential of the common node 319 drops in response to the incidence of the photon. The inverter 312 supplies a high-level pulse signal PFOUT according to the potential drop of the common node 319. With this arrangement, the incidence of the photon is detected. The counter 340 counts a count value in response to the detection of the photon.

Here, the control circuit 210 can select a plurality of pixels at the same time, or can select any one of the plurality of pixels. In a case where a plurality of pixels is selected at the same time, signals of the pixels are added. The addition operation is called pixel addition.

Furthermore, as the low level of the selection signal, an on-state voltage $V_{ON}$ satisfying the following formulas is set.

$$VDD - V_{EX} - V_{thp} < V_{ON} \quad \text{Formula 1}$$

$$VDD - V_{thp} > V_{ON} \quad \text{Formula 2}$$

In the above formulas, $V_{EX}$ represents an excess bias of the SPAD 321 or the like. $V_{thp}$ represents a threshold voltage of the selection transistor 321 and the like.

For example, it is assumed that the power-supply voltage VDD is set to 1 volt (V), the excess bias $V_{EX}$ is set to 3 volts (V), and the threshold voltage $V_{thp}$ is set to 1 volt (V). In this case, an on-state voltage $V_{ON}$ higher than −3 volts (V) and lower than 0 volts (V) is set according to Formulas 1 and 2. Within this range, for example, an on-state voltage $V_{ON}$ of −1 volt (V) is set. Meanwhile, as the high level of the selection signal, the power-supply voltage VDD (1 volt or the like) is set, for example.

Furthermore, a difference between the power-supply voltage VDD and the excess bias $V_{EX}$ on the left-hand side of Formula 1 corresponds to a potential of the cathode of the SPAD 331 or the like after the potential drop due to the photon. Therefore, Formula 1 indicates a relation in which the on-state voltage $V_{ON}$ is smaller than a difference between the potential of the cathode after the potential drop due to the photon and the threshold voltage $V_{thp}$.

Operation Example of Solid-State Image Sensor

Figure 8:
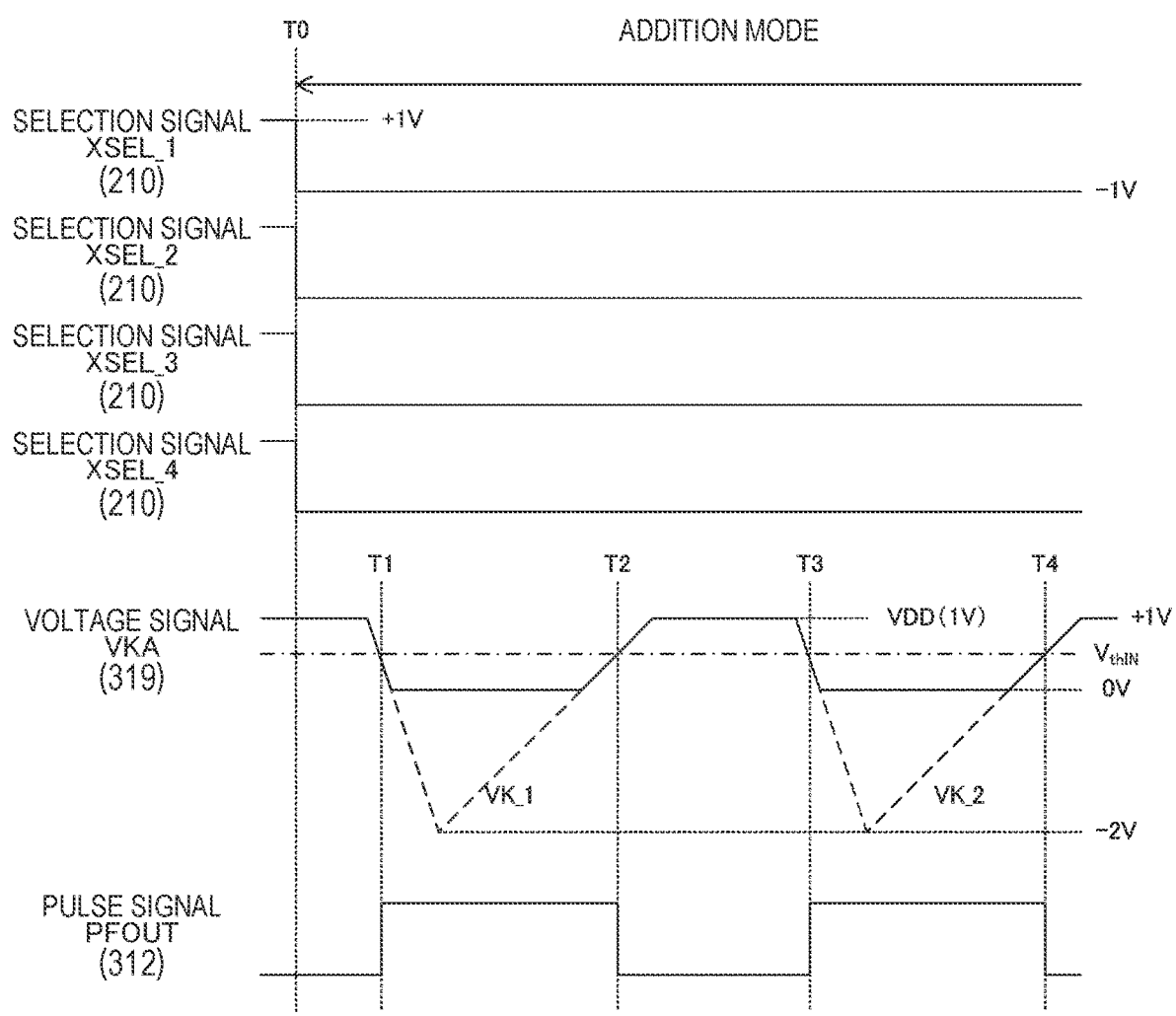
FIG. 8 is a timing chart illustrating an example of operation of the solid-state image sensor in an addition mode according to the first embodiment of the present technology.

FIG. 8 is a timing chart illustrating an example of operation of the solid-state image sensor in an addition mode according to the first embodiment of the present technology. Here, the addition mode is a mode in which pixel addition is performed. For example, in a case where illuminance of ambient light is lower than a predetermined value, the addition mode is used.

It is assumed that the addition mode is set at Timing T0. The control circuit 210 selects the pixels 301 to 304 and changes levels of the selection signals XSEL_1 to XSEL_4 corresponding thereto from the high level to the low level.

When a photon is incident on the pixel 301 immediately before Timing T1, the cathode potential VK_1 in the pixel 301 drops. A dotted line in the drawing indicates variation of the cathode potential VK_1. The cathode potential VK_1 drops by the excess bias corresponding to avalanche multiplication. When it is assumed that the power-supply voltage VDD is 1 volt (V) and the excess bias is 3 volts (V), the cathode potential VK_1 drops to −2 volts (V).

Meanwhile, an on-state voltage $V_{ON}$ satisfying Formulas 1 and 2 is set to the gates of the selection transistors 321 and 322. Therefore, when a potential of the sources of the transistors, that is, a voltage between a potential VKA of the common node 319 and the on-state voltage $V_{ON}$ becomes less than the threshold voltage $V_{thp}$, the selection transistor 321 and the like shift to the off-state (that is, the open state). For example, in a case where the on-state voltage $V_{ON}$ is −1 volt (V) and the threshold voltage $V_{thp}$ is 1 volt (V), the selection transistor 321 and the like shift to the open state at a time point when the potential VKA decreases to 0 volts (V). Therefore, the potential VKA is fixed (in other words, clipped) at a time of dropping to 0 volts (V). With this arrangement, the potential VKA has a smaller drop amount than the cathode potential VK_1.

When the potential VKA becomes less than an inversion threshold $V_{thIN}$ of the inverter 312 at Timing T1, the pulse signal PFOUT output from the inverter 312 is inverted from the low level to the high level. For example, a value of VDD/2 (0.5 volts or the like) is set as the inversion threshold $V_{thIN}$.

Then, the cathode potential VK_1 drops to −2 volts (V) and then restores to an original power-supply voltage VDD with recharge, and the potential VKA of the common node 319 also restores to the power-supply voltage VDD.

When the potential VKA becomes equal to or more than the inversion threshold $V_{thIN}$ of the inverter 312 at Timing T2, the pulse signal PFOUT output from the inverter 312 is inverted from the high level to the low level.

Furthermore, when a photon is incident on the pixel 302 immediately before Timing T3, a cathode potential VK_2 in the pixel 302 drops to −2 volts (V). Meanwhile, the potential VKA drops to 0 volts (V).

When the potential VKA becomes less than the inversion threshold $V_{thIN}$ of the inverter 312 at Timing T3, the pulse signal PFOUT output from the inverter 312 is inverted from the low level to the high level.

Then, when the potential VKA starts restoration, and the potential VKA becomes equal to or more than the inversion threshold $V_{thIN}$ of the inverter 312 at Timing T4, the pulse signal PFOUT output from the inverter 312 is inverted from the high level to the low level.

Here, there is assumed a comparative example of a configuration in which the control circuit 210 applies an on-state voltage $V_{ON}$ not satisfying Formula 1 to the gates of the selection transistor 321 and the like of the selected pixel. In the comparative example, even when the potential VKA of the common node 319 decreases to −2 volts (V), a gate-source voltage of the selection transistor 321 and the like becomes equal to or more than the threshold voltage $V_{thp}$, and the selection transistor 321 and the like remains in the on-state (closed state). Therefore, the drop amount of the potential VKA is the same as the drop amount of the cathode potential VK_1.

In contrast, when the on-state voltage $V_{ON}$ satisfying Formula 1 is applied to the gates of the selection transistor 321 and the like, the selection transistor 321 and the like go into the off-state (open state) before the potential VKA of the common node 319 drops to −2 volts (V). With this arrangement, the potential VKA is clipped as exemplified in the figure, and the drop amount of the potential VKA is smaller than the drop amount of the cathode potential VK_1. Therefore, amplitude of the potential VKA can be reduced to less than amplitude in the comparative example. By reducing the amplitude of the potential VKA, the number of elements requiring high voltage can be reduced at and after the inverter 312, and power consumption can be reduced as compared with the comparative example.

Note that, although a configuration is also conceivable in which a circuit having a clip function is added to a subsequent stage of the comparative example, the configuration is not preferable because a circuit scale therein increases.

Note that, although four pixels are added in the addition mode, it is also possible to add two pixels.

Figure 9:
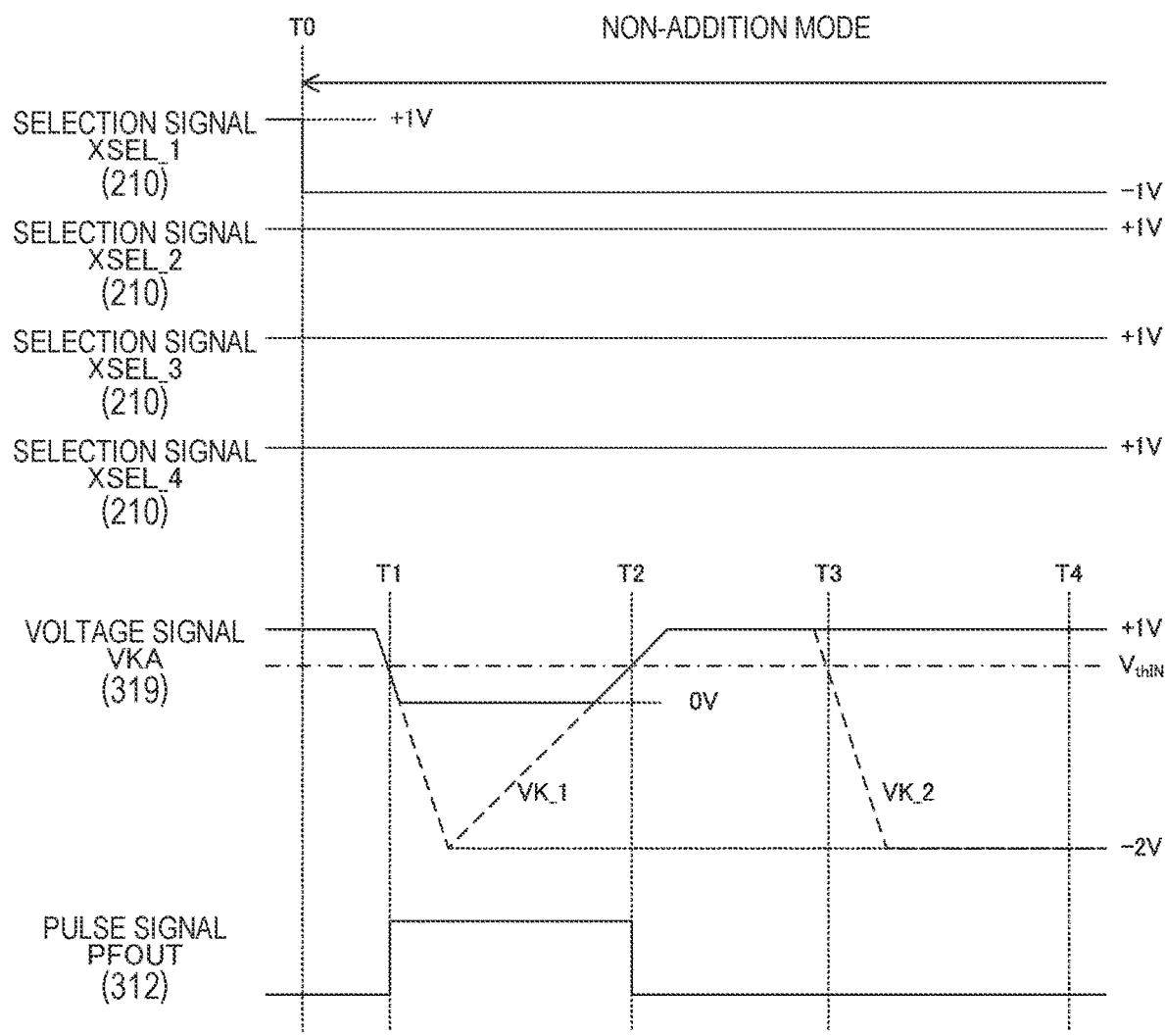
FIG. 9 is a timing chart illustrating an example of operation of the solid-state image sensor in a non-addition mode according to the first embodiment of the present technology.

FIG. 9 is a timing chart illustrating an example of operation of the solid-state image sensor in a non-addition mode according to the first embodiment of the present technology. The non-addition mode is a mode in which pixel addition is not performed.

It is assumed that the non-addition mode is set at Timing T0. For example, the control circuit 210 selects the pixel 301 and changes a level of the selection signal XSEL_1 corresponding the pixel from the high level to the low level. Meanwhile, the unselected selection signals XSEL_2 to XSEL_4 remains at the high level.

Furthermore, when a photon is incident on the pixel 301 immediately before Timing T1, the cathode potential VK_1 in the pixel 301 drops to −2 volts (V). Meanwhile, the potential VKA drops to 0 volts (V).

When the potential VKA becomes less than an inversion threshold $V_{thIN}$ of the inverter 312 at Timing T1, the pulse signal PFOUT output from the inverter 312 is inverted from the low level to the high level.

Then, when the potential VKA starts restoration, and the potential VKA becomes equal to or more than the inversion threshold $V_{thIN}$ of the inverter 312 at Timing T2, the pulse signal PFOUT output from the inverter 312 is inverted from the high level to the low level.

Furthermore, when a photon is incident on the pixel 302 immediately before Timing T3, a cathode potential VK_2 in the pixel 302 drops to −2 volts (V). Because the selection transistor 322 of an unselected pixel is in the open state according to the high-level selection signal XSEL_2, recharge is not performed, and the cathode potential VK_2 is not restored. Furthermore, because the selection transistor 322 is in the open state, the potential VKA does not vary corresponding to the drop of the cathode potential VK_2.

Figure 10:
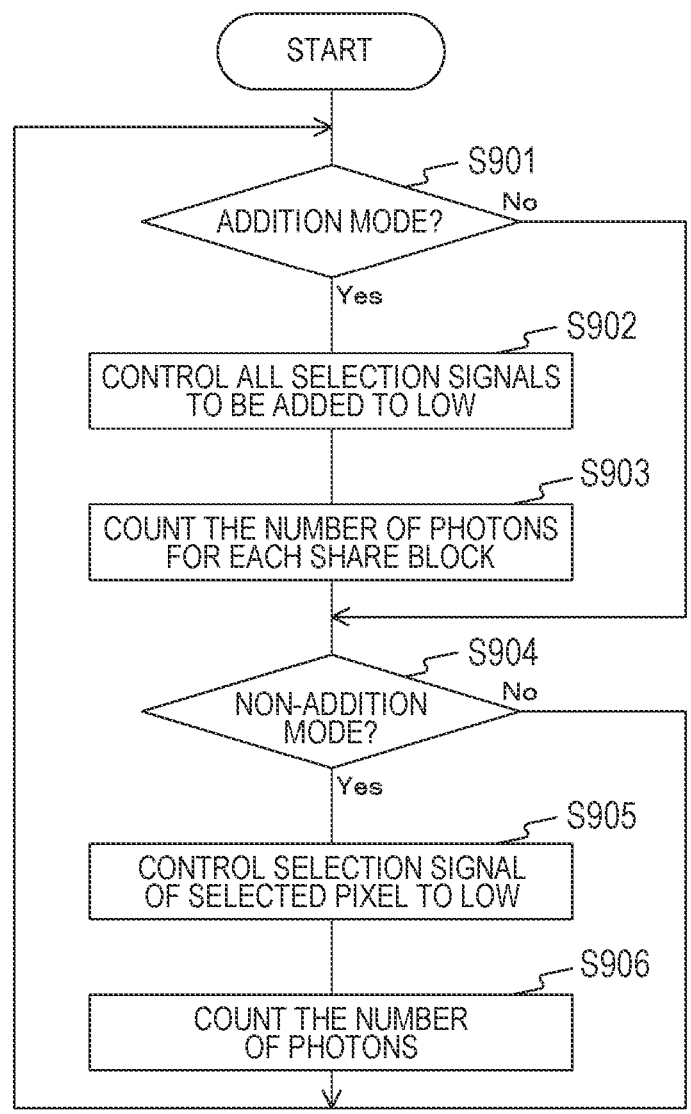
FIG. 10 is a flowchart illustrating an example of operation of the solid-state image sensor according to the first embodiment of the present technology.

FIG. 10 is a flowchart illustrating an example of operation of the solid-state image sensor according to the first embodiment of the present technology. The operation is started, for example, when a predetermined application for capturing image data is executed.

The solid-state image sensor 200 determines whether or not a current mode is the addition mode (Step S901). In a case where the current mode is the addition mode (Step S901: Yes), the control circuit 210 in the solid-state image sensor 200 controls all the selection signals to be added, which are in the pixels, to a low level that satisfies Formulas 1 and 2 (Step S902). Then, the solid-state image sensor 200 counts the number of photons for each share block 300 and generates image data (Step S903).

In a case where the current mode is not the addition mode (Step S901: No), or after Step S903, the solid-state image sensor 200 determines whether or not the current mode is the non-addition mode (Step S904). In a case where the current mode is the non-addition mode (Step S904: Yes), the control circuit 210 selects any pixel for each share block 300 and controls the selection signal of the pixel to the low level (Step S905). Then, the solid-state image sensor 200 counts the number of photons for each share block 300 and generates image data (Step S906).

In a case where the current mode is not the non-addition mode (Step S904: No), or after Step S906, the solid-state image sensor 200 returns to Step S901.

Note that, in a case where all the pixels are read in the non-addition mode, it is only required to switch a selection target and repeat Steps S905 and S906.

Thus, in the first embodiment of the present technology, the SPADs 331 to 334 are disposed on the light-receiving substrate 201, and the counter 340 and the like are disposed on the logic substrate 202, by which the circuit scale for each substrate can be reduced. With this arrangement, pixel density can be improved.

Furthermore, as exemplified in Formula 1, the control circuit 210 supplies the gates of the selection transistor 321 and the like with on-state voltage higher than a difference between the cathode potential of the SPAD 331 and the like after the potential drop and the threshold voltage $V_{thp}$, by which amplitude of the common node 319 can be reduced. With this arrangement, power saving performance of the solid-state image sensor 200 can be improved.

2. Second Embodiment

In the first embodiment described above, a plurality of pixels in the share block 300 is added, in which case the share block 300 cannot generate a plurality of pixel data in an addition mode in the addition mode, because there is one counter in the share block 300. For example, the share block 300 cannot generate pixel data obtained by adding two pixels out of four pixels and pixel data obtained by adding the remaining two pixels. A solid-state image sensor 200 of a second embodiment is different from the solid-state image sensor 200 of the first embodiment in that a counter is added.

Figure 11:
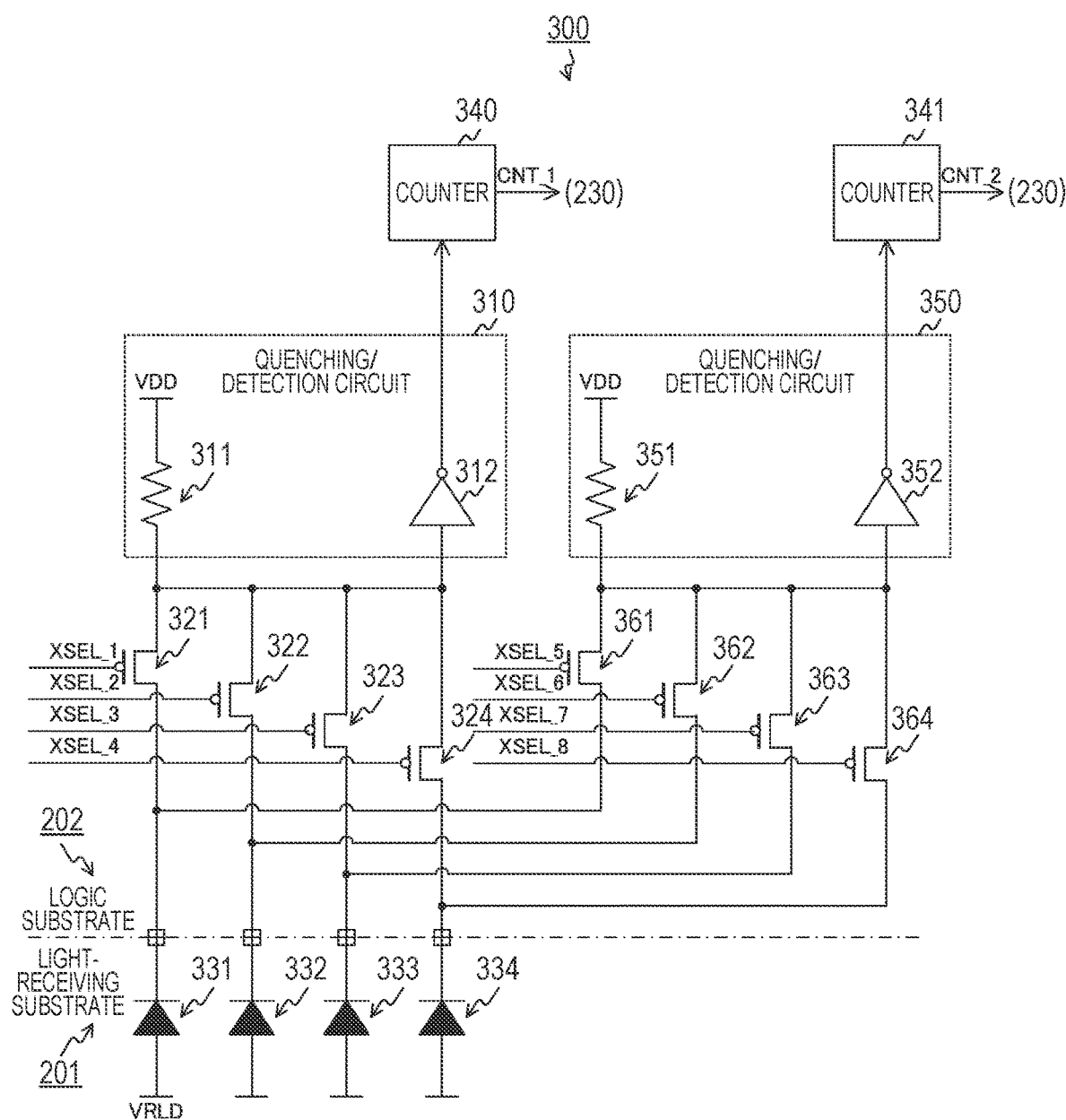
FIG. 11 is a circuit diagram illustrating a configuration example of a share block according to a second embodiment of the present technology.

FIG. 11 is a circuit diagram illustrating a configuration example of a share block 300 according to the second embodiment of the present technology. The share block 300 of the second embodiment is different from the share block 300 of the first embodiment in further including a counter 341, a quenching/detection circuit 350, and selection transistors 361 to 364.

The quenching/detection circuit 350 includes a resistor 351 and an inverter 352. A circuit configuration of the quenching/detection circuit 350 is similar to the circuit configuration of the quenching/detection circuit 310. Note that the quenching/detection circuits 310 and 350 are examples of first and second detection circuits described in the claims.

The selection transistor 361 opens and closes a path between a SPAD 331 and the quenching/detection circuit 350 according to a selection signal XSEL_5 from a control circuit 210. The selection transistor 362 opens and closes a path between a SPAD 332 and the quenching/detection circuit 350 according to a selection signal XSEL_6 from the control circuit 210. Note that the selection transistors 361 and 362 are examples of third and fourth selection transistors described in the claims.

Furthermore, the selection transistor 363 opens and closes a path between a SPAD 333 and the quenching/detection circuit 350 according to a selection signal XSEL_7 from the control circuit 210. The selection transistor 364 opens and closes a path between a SPAD 334 and the quenching/ detection circuit 350 according to a selection signal XSEL_8 from the control circuit 210.

A counter 340 generates pixel data CNT_1. Furthermore, the counter 341 counts the number of pulses of a pulse signal from the inverter 352 to generate pixel data CNT_2. Note that the counters 340 and 341 are examples of first and second counters described in the claims.

With the above-described configuration, the share block 300 can generate pixel data obtained by adding two pixels out of four pixels and data obtained by adding the remaining two pixels. For example, the control circuit 210 sets the selection signals XSEL_1, XSEL_2, XSEL_7, and XSEL_8 to the low level and sets the remaining to the high level. With this arrangement, pixel data obtained by adding the pixels 301 and 302 is output from the counter 340 as CNT_1. Furthermore, pixel data obtained by adding the remaining pixels 303 and 304 is output from the counter 341 as CNT_2. Thus, because there are two pieces of pixel data for each share block 300 in an addition mode, resolution of the image data can be improved.

Thus, according to the second embodiment of the present technology, the counter 341 is added, by which the share block 300 can generate pixel data obtained by adding two pixels out of four pixels and data obtained by adding the remaining two pixels. With this arrangement, the resolution of the image data can be improved.

3. Third Embodiment

In the first embodiment described above, the control circuit 210 supplies an on-state voltage $V_{ON}$ satisfying Formula 2 to a selected pixel, in which case characteristics of elements in a circuit may vary depending on a process, power-supply voltage, or temperature, and appropriate on-state voltage $V_{ON}$ may vary. A solid-state image sensor 200 of a third embodiment is different from the solid-state image sensor 200 of the first embodiment in that an on-state voltage $V_{ON}$ can be adjusted by a reference voltage.

Figure 12:
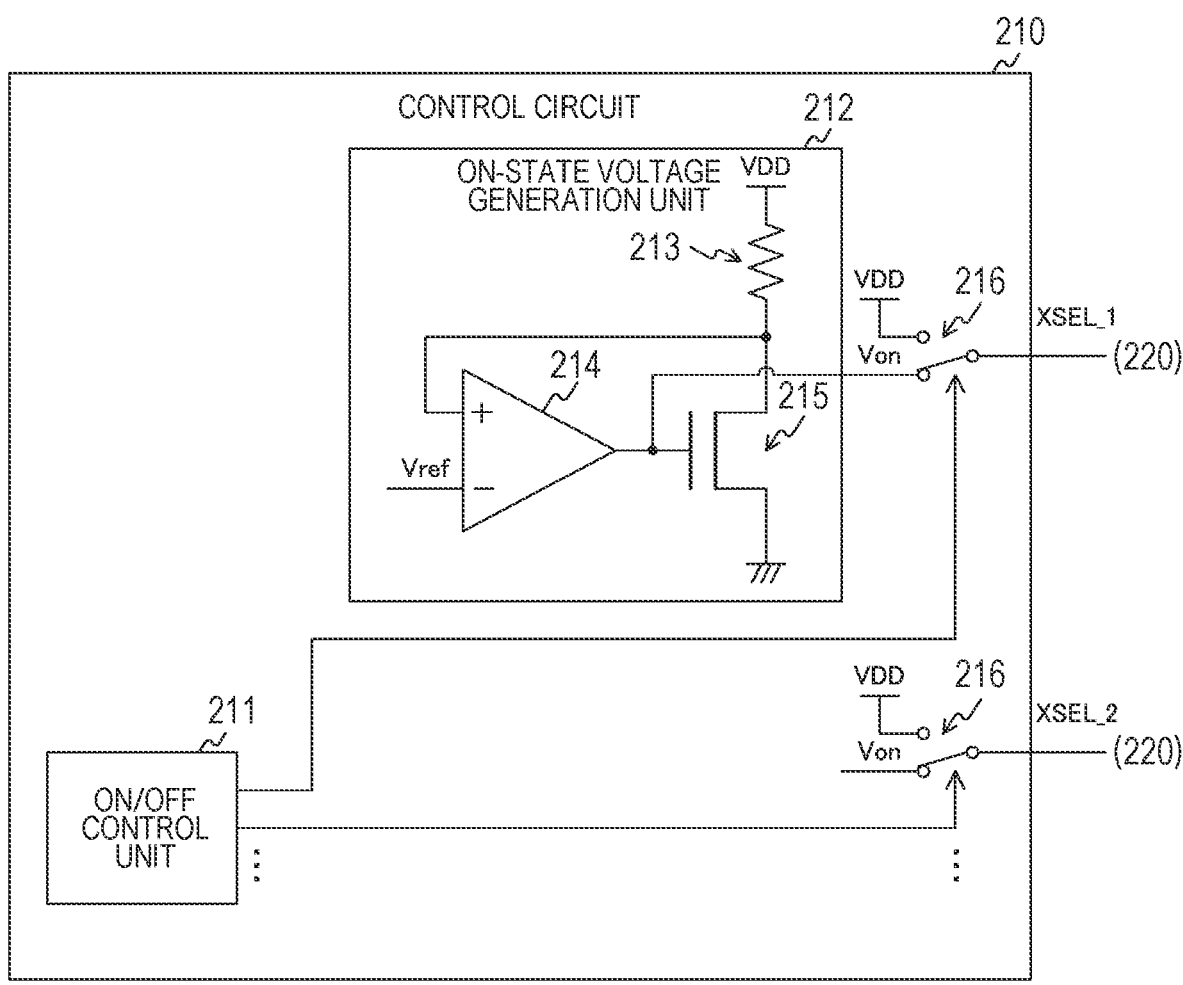
FIG. 12 is a circuit diagram illustrating a configuration example of a control circuit according to a third embodiment of the present technology.

FIG. 12 is a circuit diagram illustrating a configuration example of a control circuit 210 according to the third embodiment of the present technology. The control circuit 210 includes an on/off control unit 211, an on-state voltage generation unit 212, and a plurality of selectors 216. The selectors 216 are provided for each pixel. The on-state voltage generation unit 212 includes a resistor 213, an operational amplifier 214, and an n-channel MOS (nMOS) transistor 215.

The resistor 213 and the nMOS transistor 215 are connected in series between a power-supply voltage and a ground terminal. A non-inverting input terminal (+) of the operational amplifier 214 is connected to a connection node for the resistor 213 and the nMOS transistor 215. A reference voltage Vref is input to an inverting input terminal (−) of the operational amplifier 214. An output terminal of the operational amplifier 214 is connected to a gate of the nMOS transistor 215. Furthermore, voltage of a connection node between the operational amplifier 214 and the nMOS transistor 215 is supplied to each of the selectors 216 as an on-state voltage $V_{ON}$.

The selectors 216 select either a power-supply voltage VDD, which is an off-state voltage, or the on-state voltage $V_{ON}$, and output the selected voltage as a selection signal XSEL to a corresponding pixel in a pixel array unit 220. The on/off control unit 211 controls input destinations of the respective selectors 216.

With the above-described configuration, the control circuit 210 can generate an on-state voltage $V_{ON}$ according to the reference voltage Vref and supply either the on-state voltage $V_{ON}$ or the off-state voltage (VDD) as a selection signal. For example, for each chip, the on-state voltage $V_{ON}$ is adjusted according to the reference voltage Vref at a time of product shipment, repair, or the like. With this arrangement, even if characteristics of elements vary depending on a process, power-supply voltage, or temperature, the on-state voltage $V_{ON}$ can be set to an appropriate value.

Note that the second embodiment can be applied to the third embodiment.

Thus, according to the third embodiment of the present technology, the control circuit 210 generates an on-state voltage $V_{ON}$ according to the reference voltage Vref, by which the on-state voltage $V_{ON}$ can be set to an appropriate value by adjusting the reference voltage Vref

4. Fourth Embodiment

In the first embodiment described above, the counter 340 counts the number of pulses of the pulse signal PFOUT, in which case, the more frequently photons are incident, the more frequently a plurality of pulses overlaps, and therefore there is a possibility that errors in a count value increase due to count losses of the number of pulses. A solid-state image sensor 200 of a fourth embodiment is different from the solid-state image sensor 200 of the first embodiment in that errors are reduced by shortening a pulse width.

Figure 13:
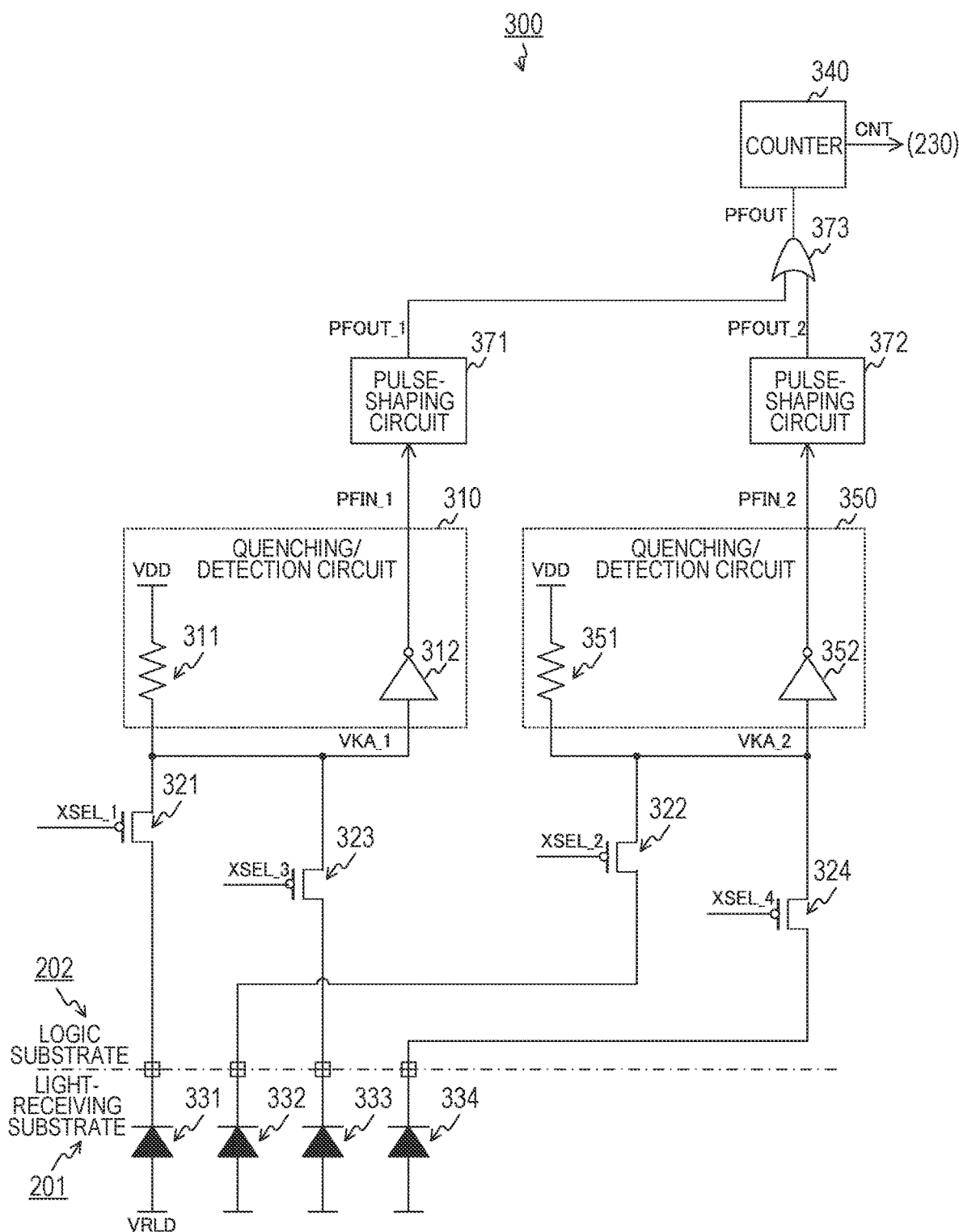
FIG. 13 is a circuit diagram illustrating a configuration example of a share block according to a fourth embodiment of the present technology.

FIG. 13 is a circuit diagram illustrating a configuration example of a share block 300 according to the fourth embodiment of the present technology. The share block 300 of the fourth embodiment is different from the share block 300 of the first embodiment in further including a quenching/detection circuit 350, pulse-shaping circuits 371 and 372, and an OR (logical OR) gate 373. The quenching/detection circuit 350 includes a resistor 351 and an inverter 352.

Furthermore, a selection transistor 322 of the fourth embodiment opens and closes a path between the quenching/detection circuit 350 and a SPAD 332, and a selection transistor 324 opens and closes a path between the quenching/detection circuit 350 and a SPAD 334.

Furthermore, an inverter 312 generates a pulse signal PFIN_1 and supplies the pulse signal PFIN_1 to the pulse-shaping circuit 371, and the inverter 352 generates a pulse signal PFIN_2 and supplies the pulse signal PFIN_2 to the pulse-shaping circuit 372.

The pulse-shaping circuit 371 shortens a pulse width of the pulse signal PFIN_1 and supplies the pulse signal PFIN_1 to the OR gate 373 as a pulse signal PFOUT 1. The pulse-shaping circuit 372 shortens a pulse width of the pulse signal PFIN_2 and supplies the pulse signal PFIN_2 to the OR gate 373 as a pulse signal PFOUT_2.

The OR gate 373 supplies the counter 340 with a logical OR of the pulse signals PFOUT_1 and PFOUT_2 as a pulse signal PFOUT. Note that the OR gate 373 is an example of a logical OR gate described in the claims.

Figure 14:
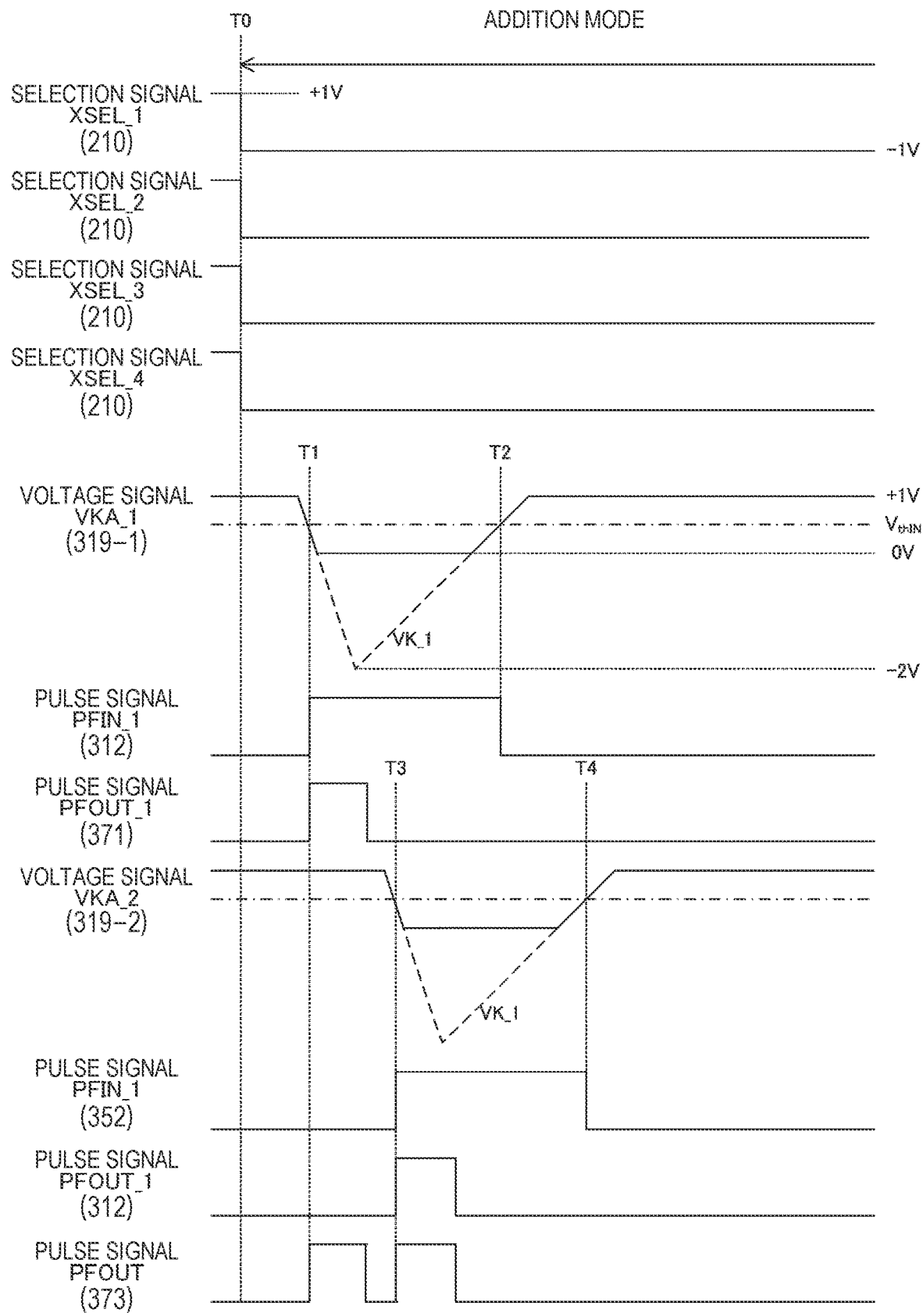
FIG. 14 is a timing chart illustrating an example of operation of a solid-state image sensor in an addition mode according to the fourth embodiment of the present technology.

FIG. 14 is a timing chart illustrating an example of operation of the solid-state image sensor 200 in an addition mode according to the fourth embodiment of the present technology. Content of control of selection signals XSEL_1 to XSEL_4 in the fourth embodiment are similar to control of the selection signals XSEL_1 to XSEL_4 in the first embodiment.

When a photon is incident on a pixel 301 immediately before Timing T1, a potential VKA drops. When the potential VKA becomes less than an inversion threshold $V_{thIN}$ of the inverter 312 at Timing T1, the pulse signal PFIN_1 output from the inverter 312 is inverted from a low level to a high level.

Then, when the potential VKA starts restoration, and the potential VKA becomes equal to or more than the inversion threshold $V_{thIN}$ of the inverter 312 at Timing T2, the pulse signal PFIN_1 is inverted from the high level to the low level. The pulse-shaping circuit 371 shortens a pulse width of the pulse signal PFIN_1 and outputs the pulse signal PFIN_1 as the pulse signal PFOUT_1.

Furthermore, when a photon is incident on a pixel 302 after a fall of the pulse signal PFOUT 1, the potential VKA drops. When the potential VKA becomes less than an inversion threshold $V_{thIN}$ of the inverter 352 at Timing T3, the pulse signal PFIN_2 output from the inverter 352 is inverted from the low level to the high level.

Then, when the potential VKA starts restoration, and the potential VKA becomes equal to or more than the inversion threshold $V_{thIN}$ of the inverter 312 at Timing T4, the pulse signal PFIN_2 is inverted from the high level to the low level. The pulse-shaping circuit 372 shortens a pulse width of the pulse signal PFIN_2 and outputs the pulse signal PFIN_2 as the pulse signal PFOUT 2.

The OR gate 373 outputs a logical OR of the pulse signals PFOUT 1 and PFOUT 1 as the pulse signal PFOUT. As exemplified in the drawing, because the pulse-shaping circuits 371 and 372 shorten pulse widths of the pulse signals, pulses overlap less frequently than in a case where the pulse widths are not shortened. With this arrangement, count losses can be reduced, and errors in the count value can be reduced. In particular, in a case of high illuminance, photons are incident more frequently, and therefore, a reduction in errors by shortening the pulse widths has a greater effect.

Note that the third embodiment can be applied to the fourth embodiment.

Thus, according to the fourth embodiment of the present technology, the pulse-shaping circuits 371 and 372 shorten the pulse widths of the pulse signals, by which frequency of overlapping pulses can be reduced, resulting in a reduction in errors in the count value 5. Fifth Embodiment In the first embodiment described above, the control circuit 210 opens a selection transistor of an unselected pixel, in which case a cathode potential of an unselected SPAD may be a floating potential and may vary. A solid-state image sensor 200 of a fifth embodiment is different from the solid-state image sensor 200 of the first embodiment in that a cathode potential of an unselected SPAD is fixed to a negative potential.

Figure 15:
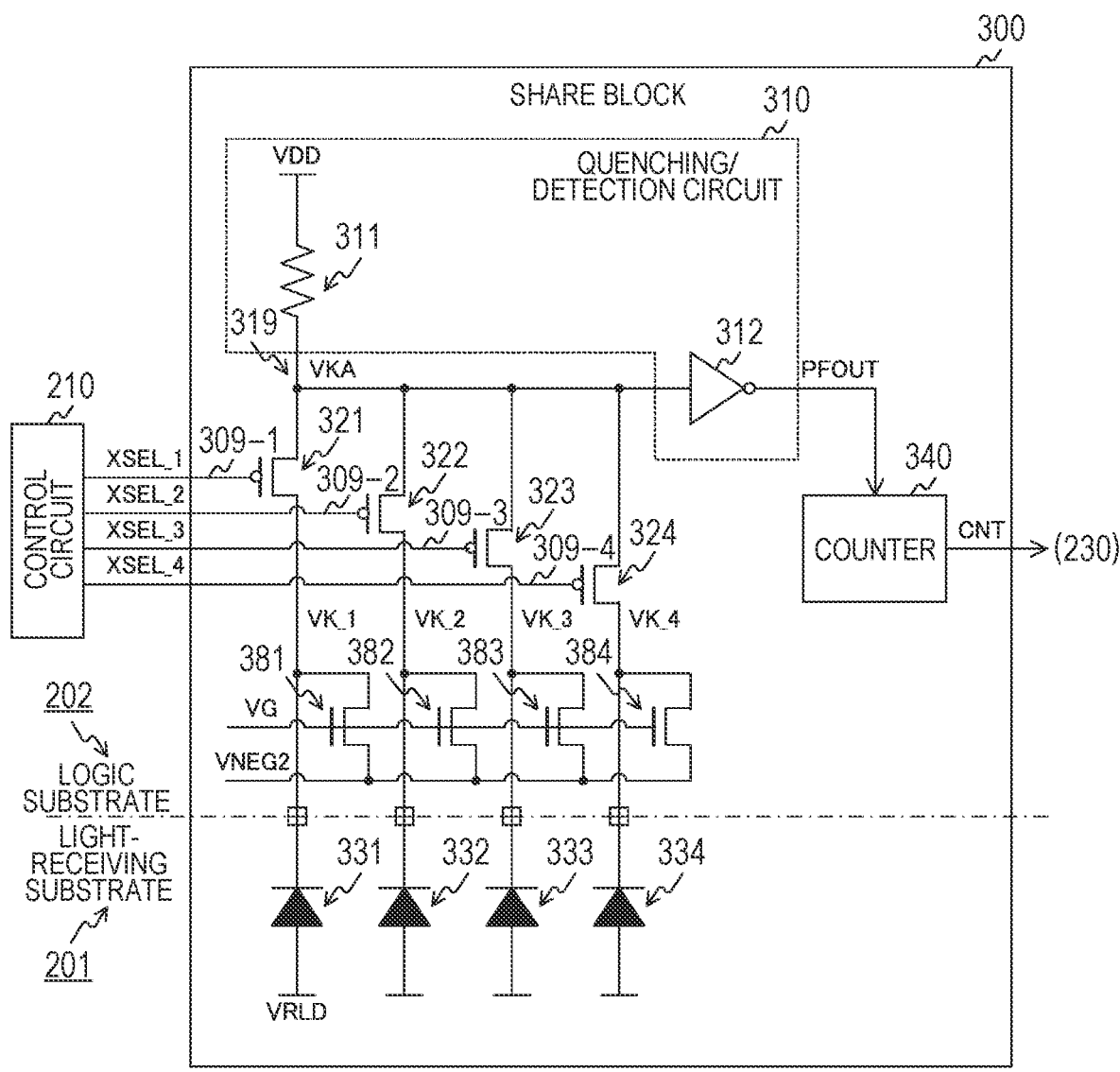
FIG. 15 is a circuit diagram illustrating a configuration example of a share block according to a fifth embodiment of the present technology.

FIG. 15 is a circuit diagram illustrating a configuration example of a share block 300 according to the fifth embodiment of the present technology. The share block 300 of the fifth embodiment is different from the share block 300 of the first embodiment in further including clip transistors 381 to 384. The clip transistors 381 to 384 are disposed on a logic substrate 202. Furthermore, for example, nMOS transistors are used as the clip transistors 381 to 384.

The clip transistor 381 is inserted between a cathode of a SPAD 331 and a predetermined negative potential VNEG2. For example, a value (−2 volts or the like) obtained by dropping a power-supply voltage VDD by a reverse bias is set as the negative potential VNEG2. The clip transistor 382 is inserted between a cathode of a SPAD 332 and the negative potential VNEG2. The clip transistor 383 is inserted between a cathode of a SPAD 333 and the negative potential VNEG2, and the clip transistor 384 is inserted between a cathode of a SPAD 334 and the negative potential VNEG2.

Furthermore, a control circuit 210 supplies a gate potential VG to each of the clip transistors 381 to 384. In a case where at least one of pixels in the share block 300 is selected, the control circuit 210 supplies a low-level gate potential VG. Meanwhile, in a case where all of the four pixels in the share block 300 are unselected, the control circuit 210 supplies a high-level gate potential VG. When the low-level gate potential VG is supplied, the clip transistors 381 to 384 fix cathode potentials VK_1 to VK_4 of the SPADs 331 to 334 to the negative potential VNEG2. With this arrangement, it is possible to reduce chances of a cathode potential of an unselected SPAD entering a floating state.

Note that at least one of the second to fourth embodiments can also be applied to the fifth embodiment.

Thus, according to the fifth embodiment of the present technology, the clip transistors 381 to 384 fix a cathode potential of an unselected SPAD, by which, when there is any unselected SPAD, it is possible to reduce chances of the cathode potential of the unselected SPAD entering the floating state.

[First Modification]

In the above-described fifth embodiment, the clip transistors 381 to 384 and subsequent elements are disposed on the logic substrate 202, but in this configuration, the number of bonding parts between substrates may increase according to an increase in the number of pixels, and capacitance of the bonding parts may increase. A solid-state image sensor 200 of a first modification of the fifth embodiment is different from the solid-state image sensor 200 of the fifth embodiment in that the number of bonding parts between the substrates is reduced.

Figure 16:
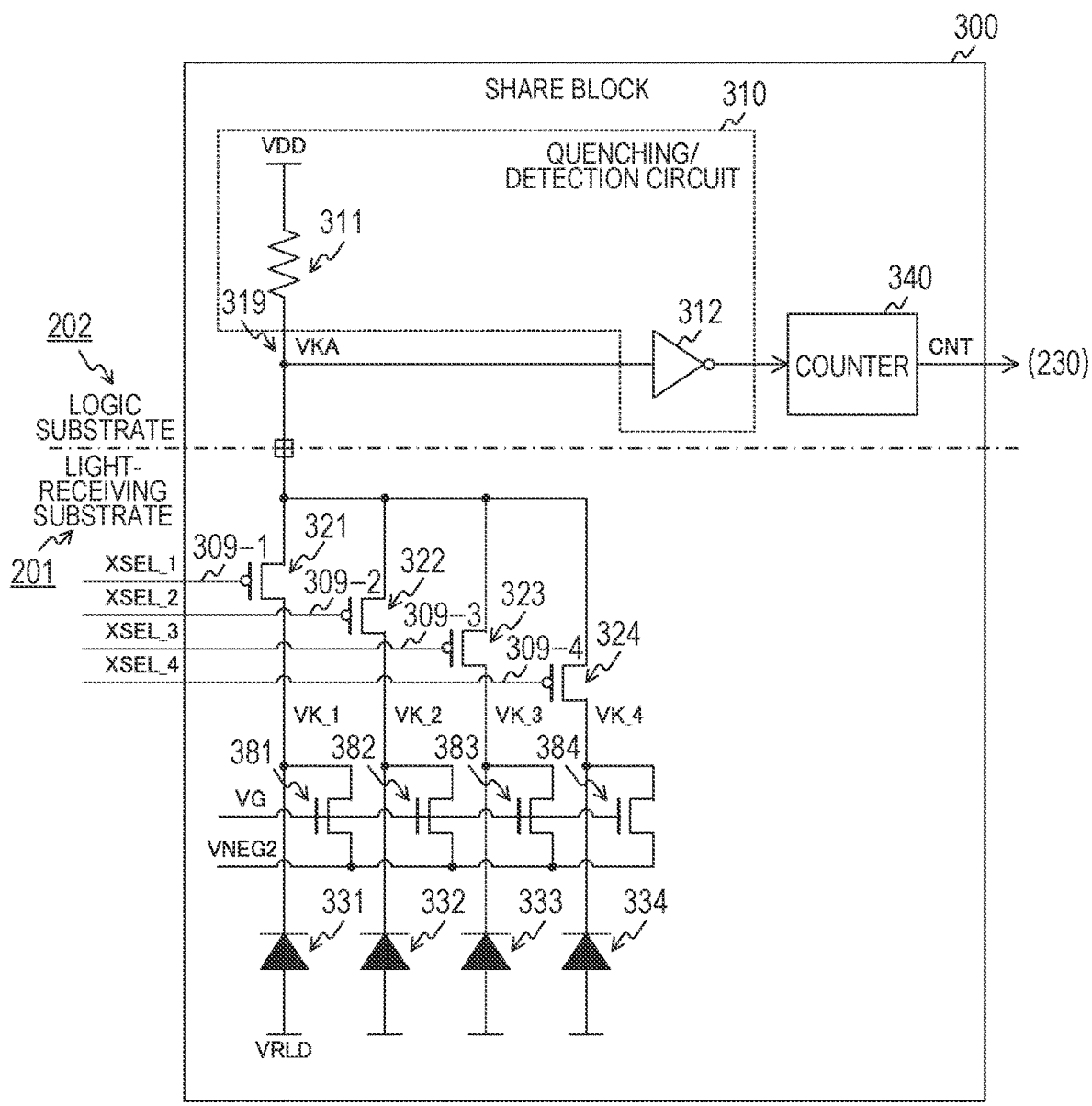
FIG. 16 is a circuit diagram illustrating a configuration example of a share block according to a first modification of the fifth embodiment of the present technology.

FIG. 16 is a circuit diagram illustrating a configuration example of a share block 300 according to the first modification of the fifth embodiment of the present technology. The share block 300 of the first modification of the fifth embodiment is different from the share block 300 of the fifth embodiment in that the selection transistors 321 to 324 and the clip transistors 381 to 384 are disposed on a light-receiving substrate 201. Respective sources of the selection transistors 321 to 324 are connected by a node on the light-receiving substrate 201. The connection node is connected to a common node 319 in the logic substrate 202 via a bonding part (Cu—Cu bonding or the like) between the substrates.

As exemplified in the drawing, by disposing the selection transistors 321 to 324 on the light-receiving substrate 201, the number of bonding parts between the substrates can be reduced. With this arrangement, capacitance generated at the bonding parts can be reduced.

Note that at least one of the second to fourth embodiments can also be applied to the first modification of the fifth embodiment.

As described above, according to the first modification of the fifth embodiment of the present technology, the selection transistors 321 to 324 are disposed on the light-receiving substrate 201, by which the number of bonding parts between the substrates can be reduced.

[Second Modification]

In the above-described fifth embodiment, the cathodes of the SPAD 331 and the like are connected to the selection transistor 321 and the like, but in this configuration, it is difficult to further reduce power consumption. A solid-state image sensor 200 of a second modification of the fifth embodiment is different from the solid-state image sensor 200 of the fifth embodiment in that resistors are inserted between the cathodes and the selection transistor 321 and the like.

Figure 17:
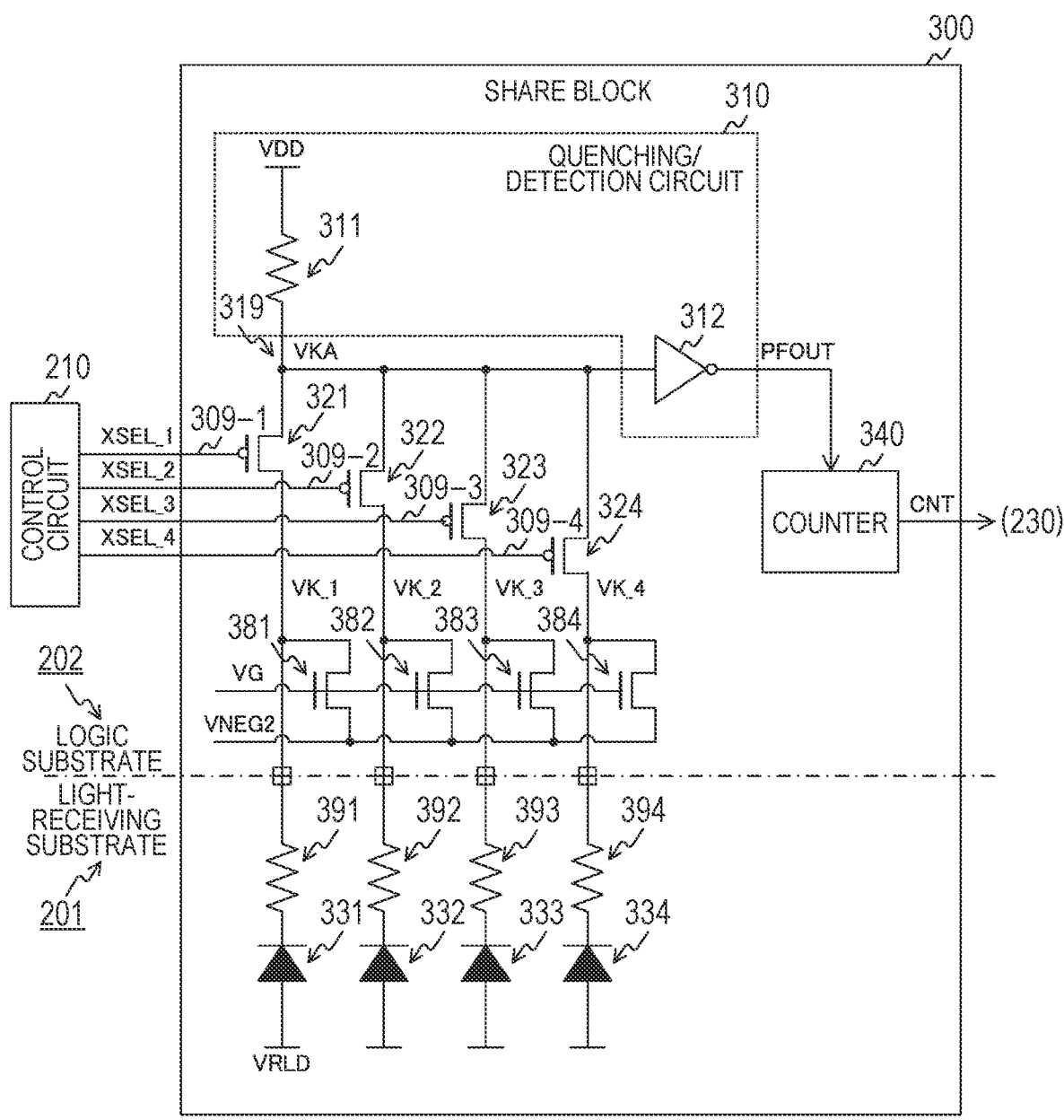
FIG. 17 is a circuit diagram illustrating a configuration example of a share block according to a second modification of the fifth embodiment of the present technology.

FIG. 17 is a circuit diagram illustrating a configuration example of the share block 300 according to the second modification of the fifth embodiment of the present technology. The share block 300 of the second modification of the fifth embodiment is different from the share block 300 of the fifth embodiment in further including resistors 391 to 394.

The resistor 391 is inserted between the cathode of the SPAD 331 and a drain of the selection transistor 321. The resistor 392 is inserted between the cathode of the SPAD 332 and a drain of the selection transistor 322. The resistor 393 is inserted between the cathode of the SPAD 333 and a drain of the selection transistor 323. The resistor 394 is inserted between the cathode of the SPAD 334 and a drain of the selection transistor 324. Furthermore, the resistors 391 to 394 are disposed on the light-receiving substrate 201.

By inserting the resistors 391 to 394 between the cathodes of the SPADs and the selection transistors, a value obtained by the resistances dividing voltage can be supplied to an inverter 312. With this arrangement, a power-supply voltage of the elements at and after the inverter 312 can be reduced, and power consumption can be reduced.

Note that at least one of the second to fourth embodiments and first modification of the fifth embodiment can also be applied to the second modification of the fifth embodiment.

In the second modification of the fifth embodiment, the resistors 391 to 394 are inserted between the cathodes of the SPADs and the selection transistors, by which a value obtained by the resistances dividing voltage can be supplied to the inverter 312. With this arrangement, a power-supply voltage of the elements at and after the inverter 312 can be reduced, and power consumption can be reduced.

6. Sixth Embodiment

In the above-described first embodiment, the circuits and elements are disposed on the two substrates in a distributed manner, but in this configuration, it is difficult to further reduce a circuit scale for each substrate. A solid-state image sensor 200 of a sixth embodiment is different from the solid-state image sensor 200 of the first embodiment in that circuits and elements are disposed on three substrates in a distributed manner.

Figure 18:
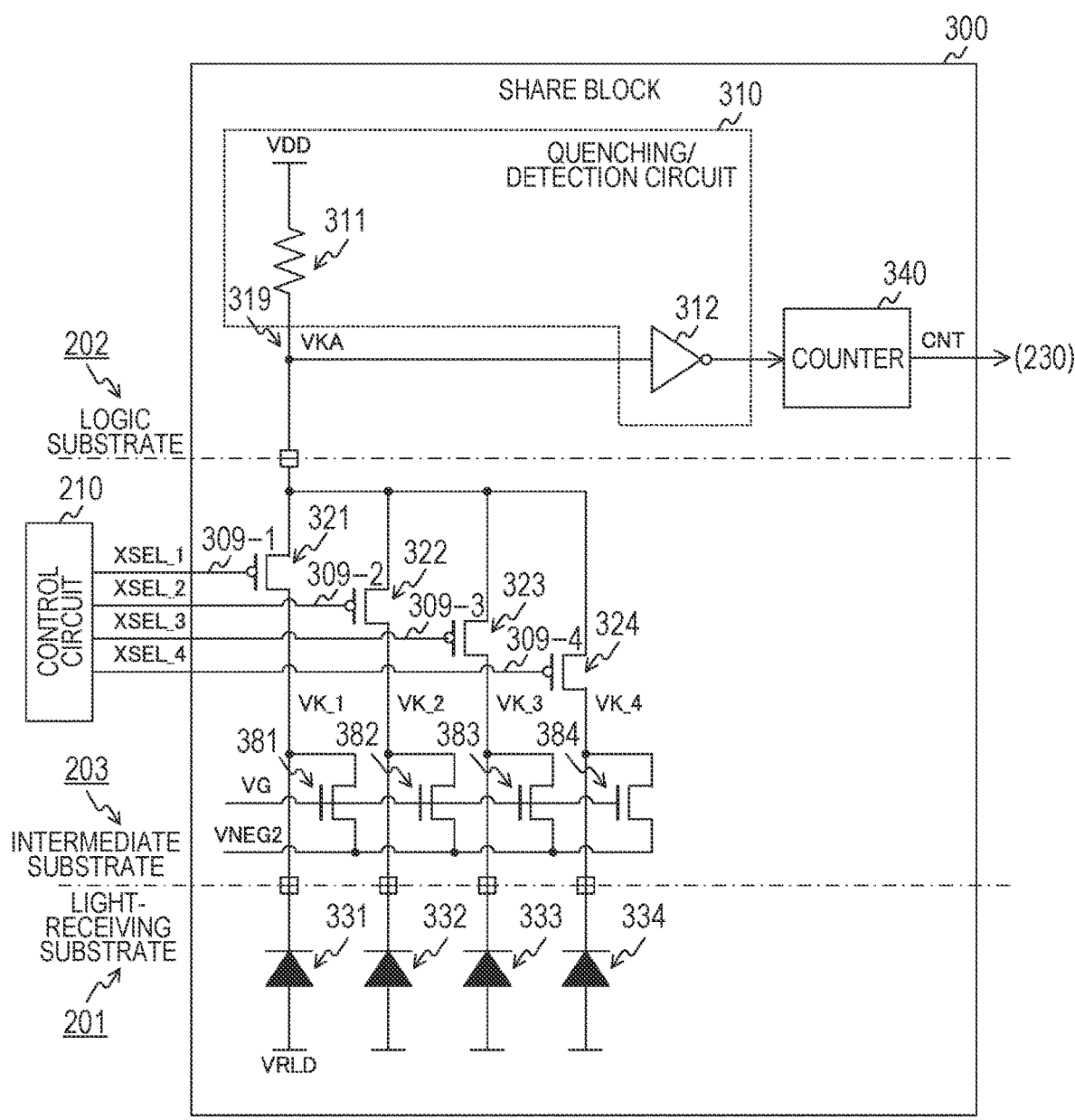
FIG. 18 is a circuit diagram illustrating a configuration example of a share block according to a sixth embodiment of the present technology.

FIG. 18 is a circuit diagram illustrating a configuration example of a share block 300 according to the sixth embodiment of the present technology. The share block 300 of the sixth embodiment is different from the share block 300 of the first embodiment in further including clip transistors 381 to 384.

A control circuit 210, selection transistors 321 to 324, and the clip transistors 381 to 384 are disposed on an intermediate substrate 203. Here, the intermediate substrate 203 is a substrate provided between a light-receiving substrate 201 and a logic substrate 202. The light-receiving substrate 201, the intermediate substrate 203, and the logic substrate 202 are stacked, and the substrates are connected by Cu—Cu connection or the like.

A quenching/detection circuit 310 and subsequent circuits are disposed on the logic substrate 202. Note that the control circuit 210 can also be disposed on the logic substrate 202.

By disposing the circuits and elements on the three substrates, which are the light-receiving substrate 201, the intermediate substrate 203, and the logic substrate 202, in a distributed manner, the circuit scale for each substrate can be reduced as compared with the first embodiment in which the circuits and elements are disposed on two substrates.

Note that at least one of the second to fourth embodiments can also be applied to the sixth embodiment.

Thus, in the sixth embodiment of the present technology, the circuits and elements are distributed on the three substrates, which are the light-receiving substrate 201, the intermediate substrate 203, and the logic substrate 202, in a distributed manner, the circuit scale for each substrate can be reduced as compared with a case where the circuits and elements are disposed on two substrates.

[First Modification]

In the above-described sixth embodiment, the quenching/detection circuit 310 is disposed on the logic substrate 202, but in this configuration, it is difficult to reduce a circuit scale of the logic substrate 202. A solid-state image sensor 200 of a first modification of the sixth embodiment is different from the solid-state image sensor 200 of the sixth embodiment in that the quenching/detection circuit 310 is disposed on the intermediate substrate 203.

Figure 19:
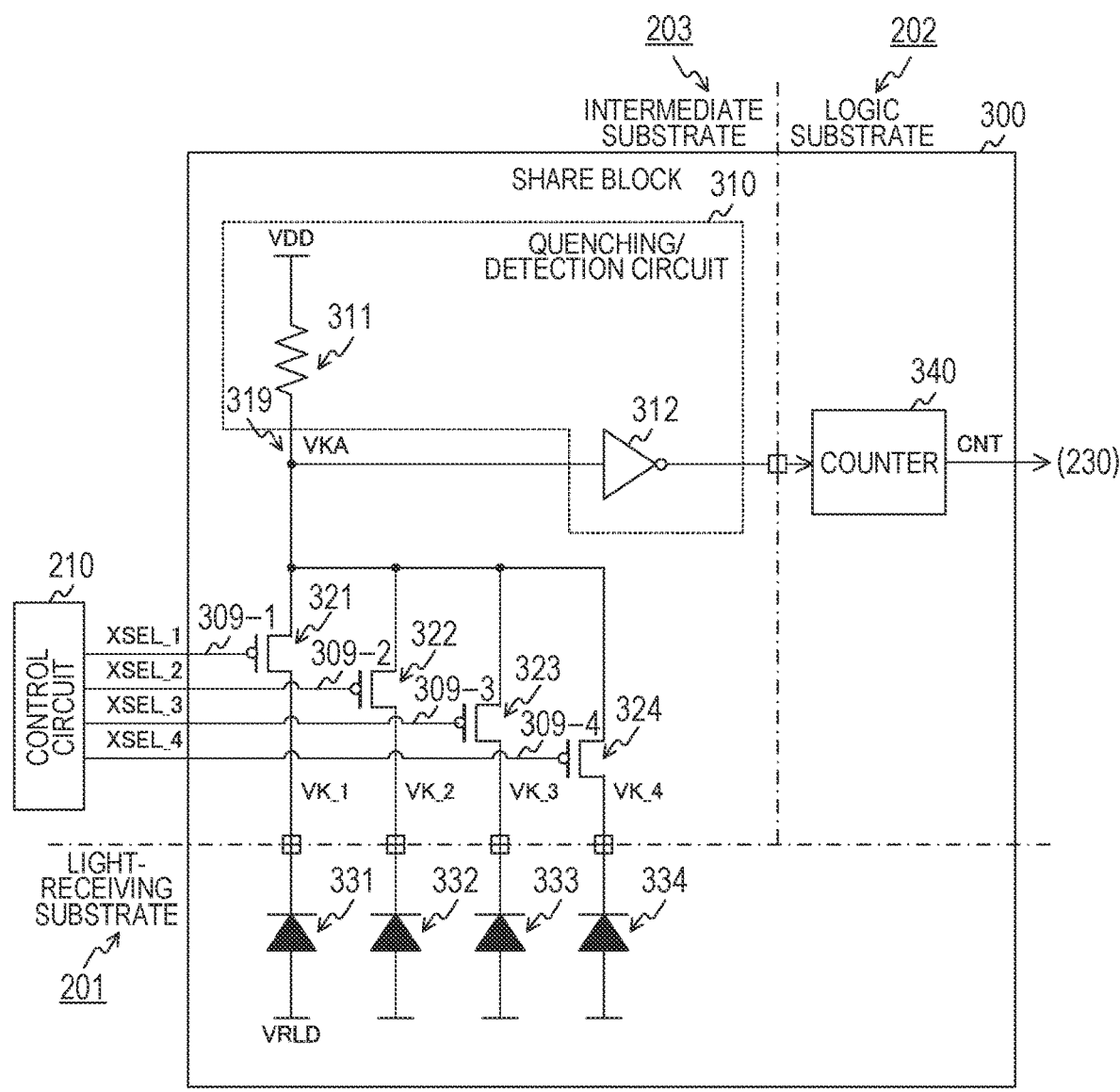
FIG. 19 is a circuit diagram illustrating a configuration example of a share block according to a first modification of the sixth embodiment of the present technology.

FIG. 19 is a circuit diagram illustrating a configuration example of the share block 300 according to the first modification of the sixth embodiment of the present technology. A share block 300 of a first modification of the sixth embodiment is different from the share block 300 of the sixth embodiment in that the quenching/detection circuit 310 is disposed on the intermediate substrate 203. Circuits at and after a counter 340 are disposed on the logic substrate 202. Furthermore, the clip transistors 381 to 384 are not provided in the share block 300.

As exemplified in the drawing, because the quenching/detection circuit 310 is disposed on the intermediate substrate 203, the circuit scale of the logic substrate 202 can be reduced accordingly.

Thus, in the first modification of the sixth embodiment of the present technology, the quenching/detection circuit 310 is disposed on the intermediate substrate 203, by which the circuit scale of the logic substrate 202 can be reduced as compared with a case where the circuit is disposed on the logic substrate 202.

[Second Modification]

In the above-described sixth embodiment, cathodes of a SPAD 331 and the like are connected to the selection transistor 321 and the like, but in this configuration, it is difficult to further reduce power consumption. A solid-state image sensor 200 of a second modification of the sixth embodiment is different from the solid-state image sensor 200 of the fifth embodiment in that resistors are inserted between cathodes and the selection transistor 321 and the like.

Figure 20:
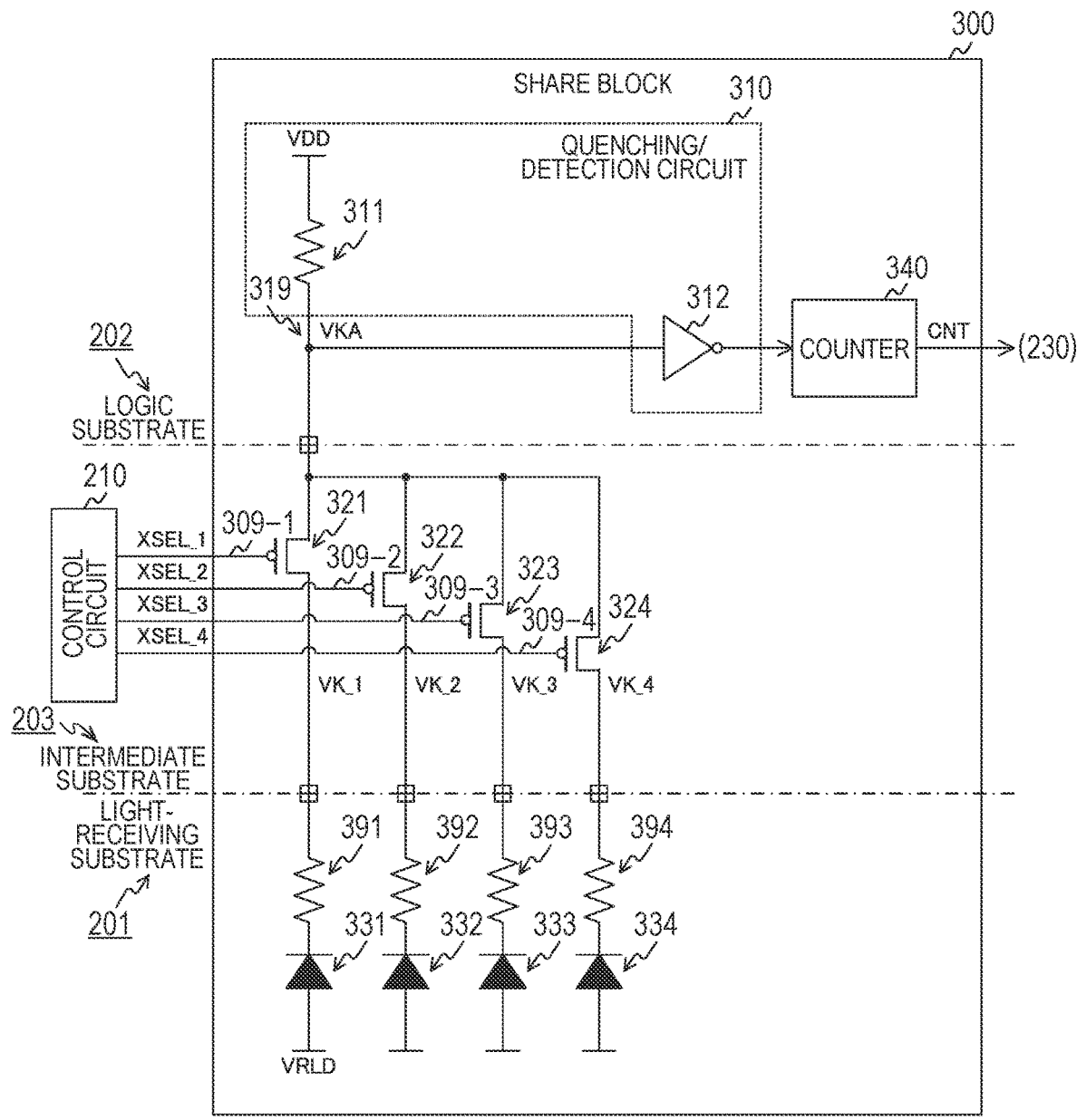
FIG. 20 is a circuit diagram illustrating a configuration example of a share block according to a second modification of the sixth embodiment of the present technology.

FIG. 20 is a circuit diagram illustrating a configuration example of a share block 300 according to a second modification of the sixth embodiment of the present technology. The share block 300 of the second modification of the sixth embodiment is different from the share block 300 of the sixth embodiment in further including resistors 391 to 394. Furthermore, the clip transistors 381 to 384 are not provided in the share block 300.

The resistor 391 is inserted between the cathode of the SPAD 331 and a drain of the selection transistor 321. The resistor 392 is inserted between the cathode of the SPAD 332 and a drain of the selection transistor 322. The resistor 393 is inserted between the cathode of the SPAD 333 and a drain of the selection transistor 323. The resistor 394 is inserted between the cathode of the SPAD 334 and a drain of the selection transistor 324. Furthermore, the resistors 391 to 394 are disposed on the light-receiving substrate 201.

By inserting the resistors 391 to 394 between the cathodes of the SPADs and the selection transistors, a value obtained by the resistances dividing voltage can be supplied to an inverter 312. With this arrangement, a power-supply voltage of the elements at and after the inverter 312 can be reduced, and power consumption can be reduced.

Note that at least one of the second to fourth embodiments can also be applied to the second modification of the sixth embodiment.

In the second modification of the sixth embodiment, the resistors 391 to 394 are inserted between the cathodes of the SPADs and the selection transistors, by which a value obtained by the resistances dividing voltage can be supplied to the inverter 312. With this arrangement, a power-supply voltage of the elements at and after the inverter 312 can be reduced, and power consumption can be reduced.

[Third Modification]

In the above-described second modification of the sixth embodiment, the quenching/detection circuit 310 is disposed on the logic substrate 202, but in this configuration, it is difficult to reduce a circuit scale of the logic substrate 202. A solid-state image sensor 200 of a third modification of the sixth embodiment is different from the solid-state image sensor 200 of the second modification of the sixth embodiment in that the quenching/detection circuit 310 is disposed on the intermediate substrate 203.

Figure 21:
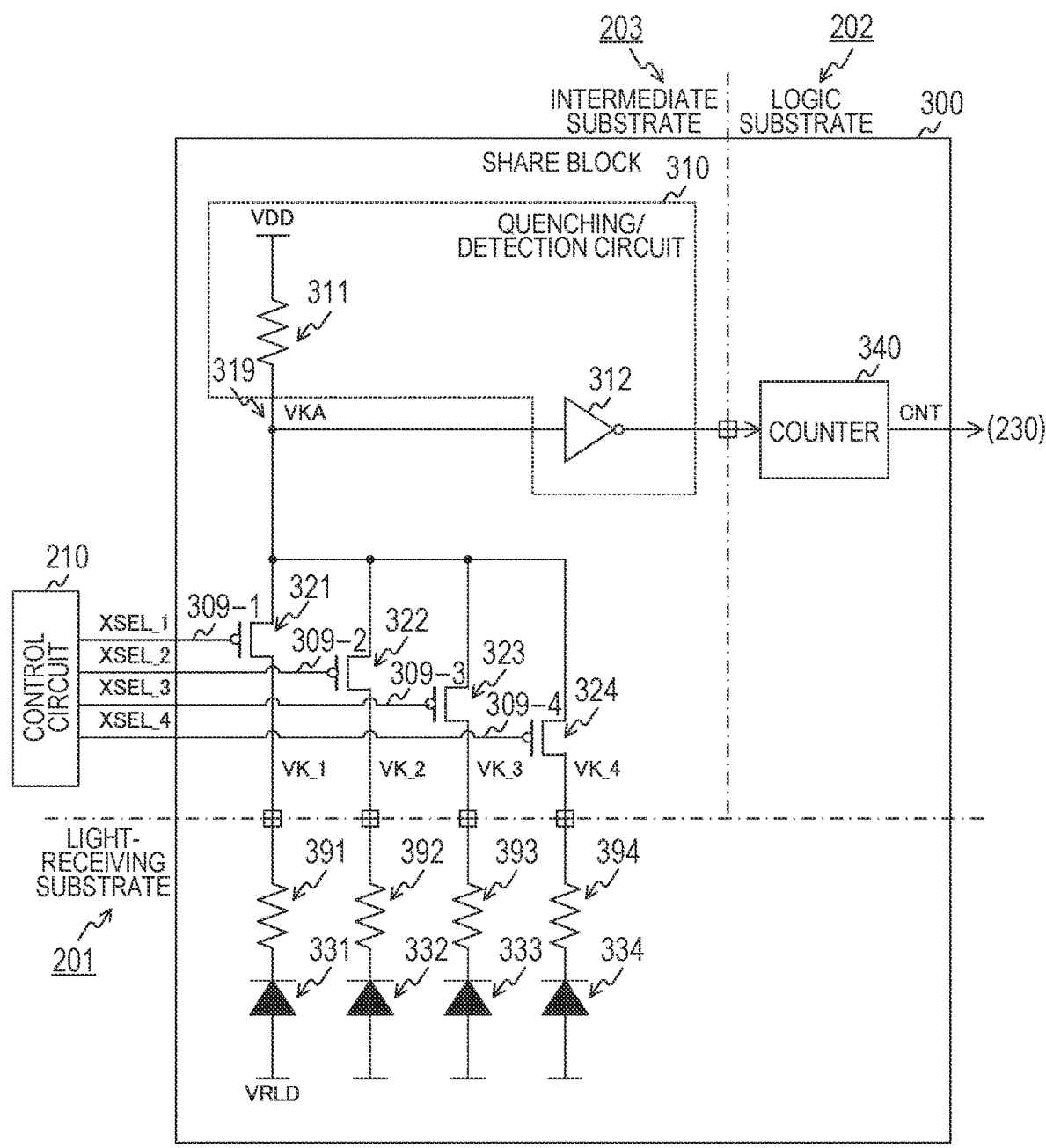
FIG. 21 is a circuit diagram illustrating a configuration example of a share block according to a third modification of the sixth embodiment of the present technology.

FIG. 21 is a circuit diagram illustrating a configuration example of a share block 300 according to the third modification of the sixth embodiment of the present technology. A share block 300 of the third modification of the sixth embodiment is different from the share block 300 of the second modification of the sixth embodiment in that the quenching/detection circuit 310 is disposed on the intermediate substrate 203. Circuits at and after a counter 340 are disposed on the logic substrate 202.

As exemplified in the drawing, because the quenching/detection circuit 310 is disposed on the intermediate substrate 203, the circuit scale of the logic substrate 202 can be reduced accordingly.

Thus, in the third modification of the sixth embodiment of the present technology, the quenching/detection circuit 310 is disposed on the intermediate substrate 203, by which the circuit scale of the logic substrate 202 can be reduced as compared with a case where the circuit is disposed on the logic substrate 202.

7. Example of Application to Mobile Object

The technology according to the present disclosure (the present technology) can be applied to various products. For example, the technology according to the present disclosure may be implemented as a device mounted on a mobile object of any kind such as an automobile, an electric vehicle, a hybrid electric vehicle, a motorcycle, a bicycle, a personal mobility, an airplane, a drone, a ship, or a robot.

Figure 22:
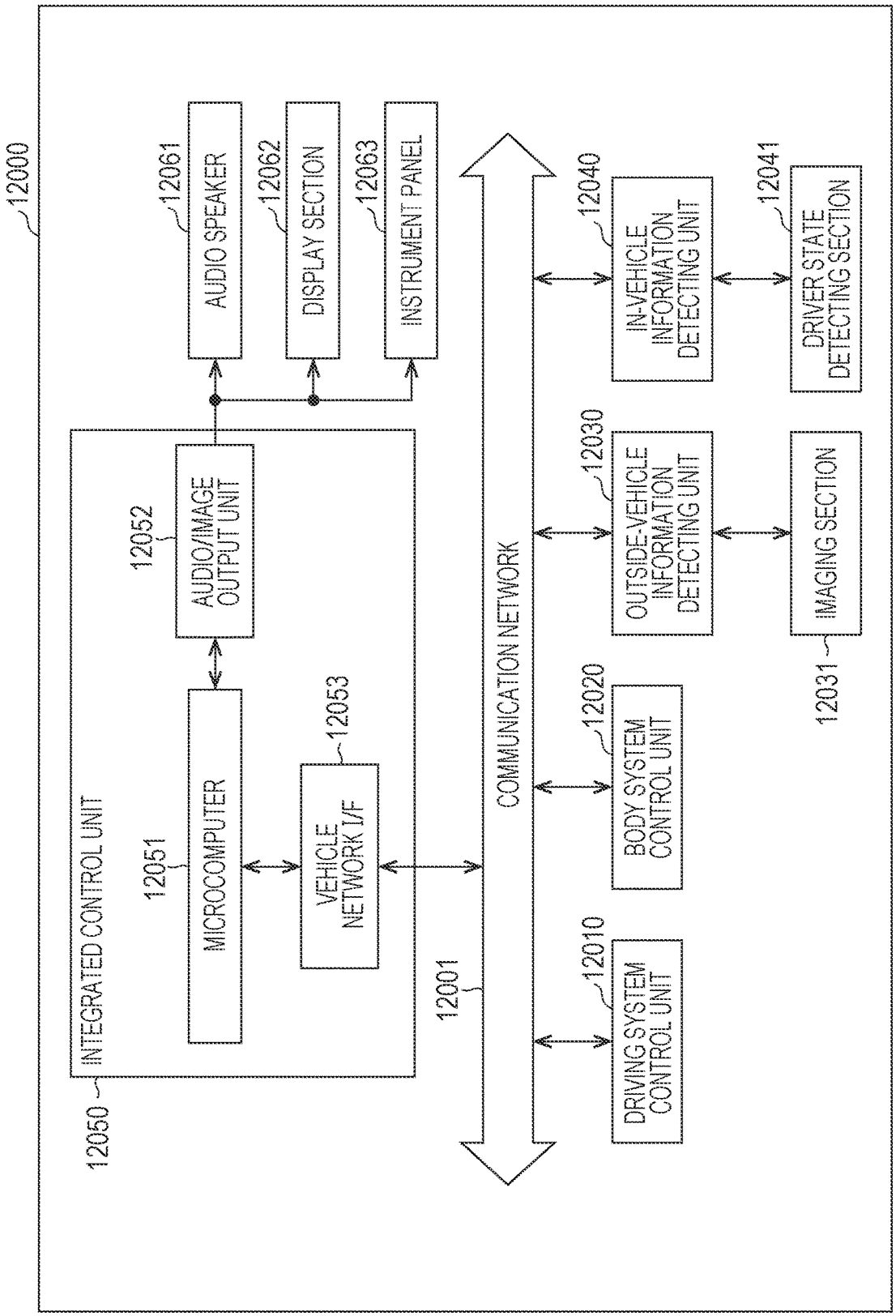
FIG. 22 is a block diagram illustrating a configuration example of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and an in-vehicle network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ALIAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of information of outside of the vehicle, the information being acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example in FIG. 22, an audio speaker 12061, a display section 12062, and an instrument panel 12063 are illustrated as the output device. The display section 12062 may, for example, include at least one of an on-board display and a head-up display.

Figure 23:
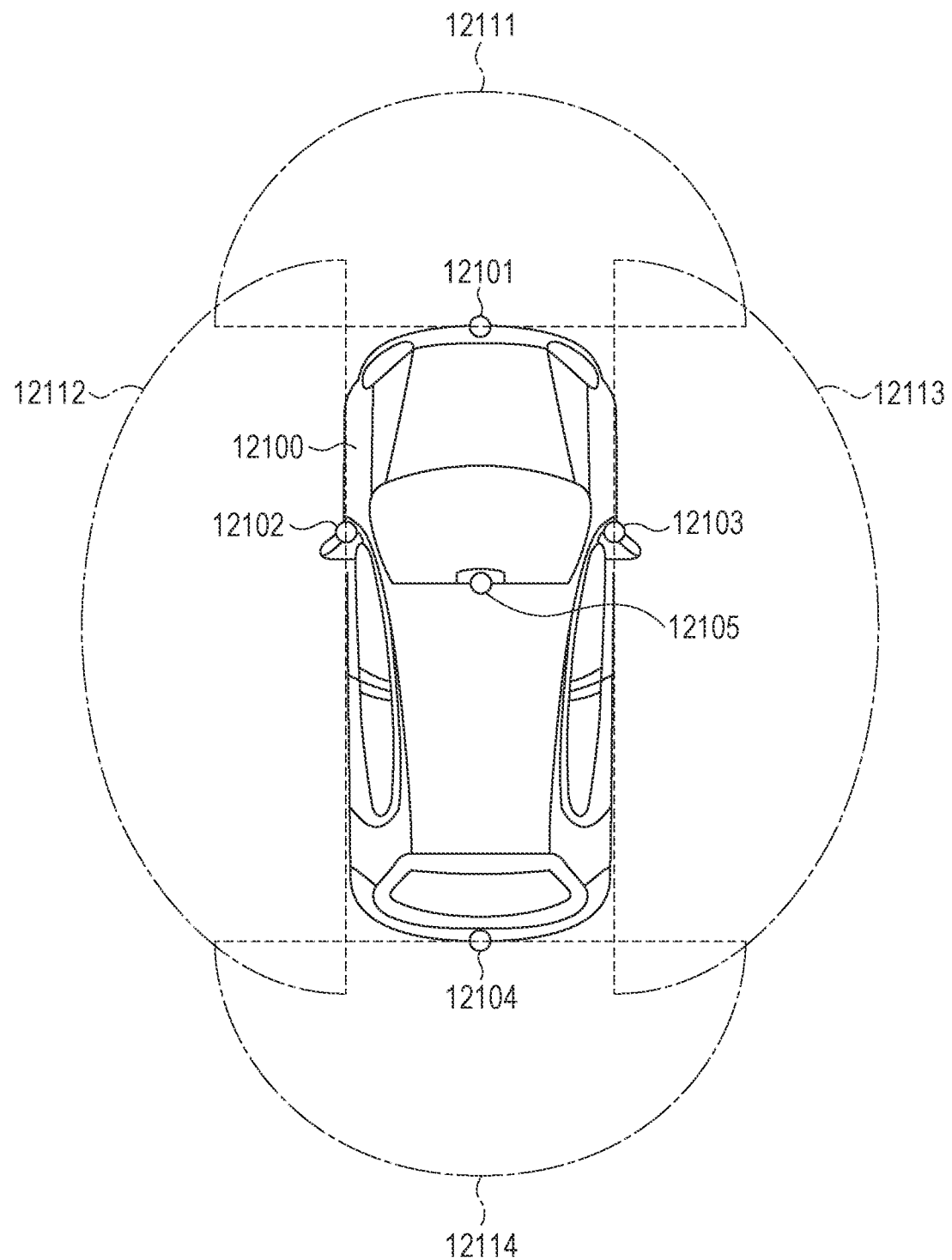
FIG. 23 is an explanatory diagram illustrating an example of an installation position of an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are provided at positions such as, for example, a front nose, side mirrors, rear bumper, and back door of the vehicle 12100, and an upper part of a front window, or the like, of a vehicle interior of the vehicle 12100. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the side mirrors mainly acquire images of views at sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure may be applied has been described above. The technology according to the present disclosure may be applied to, for example, the imaging section 12031 among the configurations described above. Specifically, the imaging device 100 in FIG. 1 can be applied to the imaging section 12031. By applying the technology according to the present disclosure to the imaging section 12031, performance of power saving or the like can be improved.

Note that the above-described embodiments indicate examples for embodying the present technology, and matters in the embodiments and matters specifying the invention in the claims correlate to each other. Similarly, the matters specifying the invention in the claims and matters denoted by the same names in the embodiments of the present technology correlate to each other. However, the present technology is not limited to the embodiments, and can be embodied by performing various types of modifications on the embodiments within a range not departing from the gist of the technology.

Note that the effects described herein are only examples, and the effects of the present technology are not limited to these effects. Additional effects may also be obtained.

Note that the present technology can have the following configurations.

(1) A solid-state image sensor including
a light-receiving substrate on which a plurality of avalanche photodiodes is disposed, each of the avalanche photodiodes generating a current corresponding to incident of a photon, and
a logic substrate on which a counter is disposed, the counter counting the number of the photons on the basis of the current of a selected avalanche photodiode among the plurality of avalanche photodiodes.

(2) The solid-state image sensor according to (1),
in which the plurality of avalanche photodiodes includes first and second avalanche photodiodes, and
there are further disposed, on the logic substrate, a detection circuit that generates a pulse signal on the basis of a voltage according to the current and outputs the pulse signal to the counter, a first selection transistor that opens and closes a path between one end of the first avalanche photodiode and the detection circuit, a second selection transistor that opens and closes a path between one end of the second avalanche photodiode and the detection circuit, and a control circuit that controls voltage of each gate of the first and second selection transistors.

(3) The solid-state image sensor according to (2),
in which, in a case where at least one of the first and second selection transistors is in a closed state, the control circuit supplies the gate with a voltage higher than a difference between a potential of the one end after a potential drop due to the photon and each threshold voltage of the first and second selection transistors.

(4) The solid-state image sensor according to (2) or (3),
in which the counter includes first and second counters,
the detection circuit includes a first detection circuit that generates a first pulse signal and supplies the first pulse signal to the first counter, and a second detection circuit that generates a second pulse signal and supplies the second pulse signal to the second counter,
the first selection transistor opens and closes a path between one end of the first avalanche photodiode and the first detection circuit,
the second selection transistor opens and closes a path between one end of the second avalanche photodiode and the second detection circuit,
there are further disposed, on the logic substrate, a third selection transistor that opens and closes a path between one end of the first avalanche photodiode and the second detection circuit, and a fourth selection transistor that opens and closes a path between one end of the second avalanche photodiode and the second detection circuit, and
the control circuit further controls voltage of each gate of the third and fourth selection transistors.

(5) The solid-state image sensor according to any one of (2) to (4),
in which the control circuit includes
an on-state voltage generation unit that generates a voltage according to a predetermined reference voltage as an on-state voltage, and
a selector that selects either an off-state voltage different from the on-state voltage or the on-state voltage, and supplies the selected voltage to the gate.

(6) The solid-state image sensor according to (2),
in which the detection circuit includes a first detection circuit that generates a first pulse signal and a second detection circuit that generates a second pulse signal,
the first selection transistor opens and closes a path between one end of the first avalanche photodiode and the first detection circuit,
the second selection transistor opens and closes a path between one end of the second avalanche photodiode and the second detection circuit, and
there are further disposed, on the logic substrate, a first pulse-shaping circuit that shortens a pulse width of the first pulse signal, a second pulse-shaping circuit that shortens a pulse width of the second pulse signal, and a logical OR gate that supplies the counter with a logical OR of the first and second pulse signals having shortened pulse widths.

(7) The solid-state image sensor according to any one of (2) to (6),
in which there is further disposed, on the logic substrate, a clip transistor that fixes a potential of the one end to a predetermined value.

(8) The solid-state image sensor according to (1),
in which the plurality of avalanche photodiodes includes first and second avalanche photodiodes,
there is further disposed, on the logic substrate, a detection circuit that generates a pulse signal on the basis of a voltage according to the current and outputs the pulse signal to the counter, and
there are further disposed, on the light-receiving substrate, a first selection transistor that opens and closes a path between one end of the first avalanche photodiode and the detection circuit, a second selection transistor that opens and closes a path between one end of the second avalanche photodiode and the detection circuit, and a clip transistor that fixes a potential of the one end to a predetermined value.

(9) The solid-state image sensor according to (8),
in which there are further disposed, on the light-receiving substrate, a first resistor that is inserted between one end of the first avalanche photodiode and the first selection transistor, and a second resistor that is inserted between one end of the second avalanche photodiode and the second selection transistor.

(10) The solid-state image sensor according to (1), further including an intermediate substrate,
in which the plurality of avalanche photodiodes includes first and second avalanche photodiodes, and
there are further disposed, on the intermediate substrate, a first selection transistor that opens and closes a path between one end of the first avalanche photodiode and a common node, and a second selection transistor that opens and closes a path between one end of the second avalanche photodiode and the common node.

(11) The solid-state image sensor according to (10),
in which there is further disposed, on the logic substrate, a detection circuit that generates a pulse signal on the basis of a potential of the common node and outputs the pulse signal to the counter, and
there is further disposed, on the intermediate substrate, a clip transistor that fixes a potential of the one end to a predetermined value.

(12) The solid-state image sensor according to (10),
in which there is further disposed, on the intermediate substrate, a detection circuit that generates a pulse signal on the basis of a potential of the common node and outputs the pulse signal to the counter.

(13) The solid-state image sensor according to (10),
in which there are further disposed, on the light-receiving substrate, a first resistor that is inserted between one end of the first avalanche photodiode and the first selection transistor, and a second resistor that is inserted between one end of the second avalanche photodiode and the second selection transistor.

(14) The solid-state image sensor according to (13),
in which there is further disposed, on the logic substrate, a detection circuit that generates a pulse signal on the basis of a potential of the common node and outputs the pulse signal to the counter.

(15) The solid-state image sensor according to (13),
in which there is further disposed, on the intermediate substrate, a detection circuit that generates a pulse signal on the basis of a potential of the common node and outputs the pulse signal to the counter.

(16) An imaging device including
a light-receiving substrate on which a plurality of avalanche photodiodes is disposed, each of the avalanche photodiodes generating a current corresponding to incident of a photon,
a logic substrate on which a counter is disposed, the counter counting the number of the photons on the basis of the current of a selected avalanche photodiode among the plurality of avalanche photodiodes, and
a recording unit that records a digital signal that indicates a count value of the counter.

REFERENCE SIGNS LIST

100 Imaging device
110 Imaging lens
120 Recording unit
130 Imaging control unit
200 Solid-state image sensor
201 Light-receiving substrate
202 Logic substrate
203 Intermediate substrate
210 Control circuit
211 On/off control unit
212 On-state voltage generation unit
213, 311, 351, 391 to 394 Resistor
214 Operational amplifier
215 nMOS transistor
216 Selector
220 Pixel array unit
230 Signal processing unit
300 Share block
301 to 304 Pixel
310, 350 Quenching/detection circuit
312, 352 Inverter
321 to 324, 361 to 364 Selection transistor
331 to 334 SPAR
340, 341 Counter
371, 372 Pulse-shaping circuit
373 OR (logical OR) gate
381 to 384 Clip transistor
391 to 394 Logic gate
12031 Imaging section

The invention claimed is:

1. A solid-state image sensor comprising:
a light-receiving substrate on which a plurality of avalanche photodiodes is disposed, each of the avalanche photodiodes generating a current corresponding to incidence of a photon; and
a logic substrate on which a counter is disposed, the counter counting a number of the photons on a basis of the current of a selected avalanche photodiode among the plurality of avalanche photodiodes, wherein
the plurality of avalanche photodiodes includes first and second avalanche photodiodes, and
there are further disposed, on the logic substrate, a detection circuit that generates a pulse signal on a basis of a voltage according to the current and outputs the pulse signal to the counter, a first selection transistor that opens and closes a path between one end of the first avalanche photodiode and the detection circuit, a second selection transistor that opens and closes a path between one end of the second avalanche photodiode and the detection circuit, and a control circuit that controls a voltage of each gate of the first and second selection transistors.

2. The solid-state image sensor according to claim 1, wherein, in a case where at least one of the first and second selection transistors is in a closed state, the control circuit supplies the gate with a voltage higher than a difference between a potential of the one end after a potential drop due to the photon and each threshold voltage of the first and second selection transistors.

3. The solid-state image sensor according to claim 1, wherein
the counter includes first and second counters,
the detection circuit includes a first detection circuit that generates a first pulse signal and supplies the first pulse signal to the first counter, and a second detection circuit that generates a second pulse signal and supplies the second pulse signal to the second counter,
the first selection transistor opens and closes a path between one end of the first avalanche photodiode and the first detection circuit,
the second selection transistor opens and closes a path between one end of the second avalanche photodiode and the second detection circuit,
there are further disposed, on the logic substrate, a third selection transistor that opens and closes a path between one end of the first avalanche photodiode and the second detection circuit, and a fourth selection transistor that opens and closes a path between one end of the second avalanche photodiode and the second detection circuit, and
the control circuit further controls voltage of each gate of the third and fourth selection transistors.

4. The solid-state image sensor according to claim 1, wherein
the control circuit includes
an on-state voltage generation unit that generates a voltage according to a predetermined reference voltage as an on-state voltage, and
a selector that selects either an off-state voltage different from the on-state voltage or the on-state voltage, and supplies the selected voltage to the gate.

5. The solid-state image sensor according to claim 1, wherein
the detection circuit includes a first detection circuit that generates a first pulse signal and a second detection circuit that generates a second pulse signal,
the first selection transistor opens and closes a path between one end of the first avalanche photodiode and the first detection circuit,
the second selection transistor opens and closes a path between one end of the second avalanche photodiode and the second detection circuit, and there are further disposed, on the logic substrate, a first pulse-shaping circuit that shortens a pulse width of the first pulse signal, a second pulse-shaping circuit that shortens a pulse width of the second pulse signal, and a logical OR gate that supplies the counter with a logical OR of the first and second pulse signals having shortened pulse widths.

6. The solid-state image sensor according to claim 1, wherein there is further disposed, on the logic substrate, a clip transistor that fixes a potential of the one end to a predetermined value.

7. An imaging device comprising the solid-state image sensor according to claim 1.

8. The imaging device according to claim 7, wherein,
in a case where at least one of the first and second selection transistors is in a closed state, the control circuit supplies the gate with a voltage higher than a difference between a potential of the one end after a potential drop due to the photon and each threshold voltage of the first and second selection transistors.

9. The imaging device according to claim 7, wherein
the counter includes first and second counters,
the detection circuit includes a first detection circuit that generates a first pulse signal and supplies the first pulse signal to the first counter, and a second detection circuit that generates a second pulse signal and supplies the second pulse signal to the second counter,
the first selection transistor opens and closes a path between one end of the first avalanche photodiode and the first detection circuit,
the second selection transistor opens and closes a path between one end of the second avalanche photodiode and the second detection circuit,
there are further disposed, on the logic substrate, a third selection transistor that opens and closes a path between one end of the first avalanche photodiode and the second detection circuit, and a fourth selection transistor that opens and closes a path between one end of the second avalanche photodiode and the second detection circuit, and
the control circuit further controls voltage of each gate of the third and fourth selection transistors.

10. The imaging device according to claim 7, wherein
the control circuit includes
an on-state voltage generation unit that generates a voltage according to a predetermined reference voltage as an on-state voltage, and
a selector that selects either an off-state voltage different from the on-state voltage or the on-state voltage, and supplies the selected voltage to the gate.

11. A solid-state image sensor comprising:
a light-receiving substrate on which a plurality of avalanche photodiodes is disposed, each of the avalanche photodiodes generating a current corresponding to incidence of a photon; and
a logic substrate on which a counter is disposed, the counter counting a number of the photons on a basis of the current of a selected avalanche photodiode among the plurality of avalanche photodiodes, wherein
the plurality of avalanche photodiodes includes first and second avalanche photodiodes,
there is further disposed, on the logic substrate, a detection circuit that generates a pulse signal on a basis of a voltage according to the current and outputs the pulse signal to the counter, and
there are further disposed, on the light-receiving substrate, a first selection transistor that opens and closes a path between one end of the first avalanche photodiode and the detection circuit, a second selection transistor that opens and closes a path between one end of the second avalanche photodiode and the detection circuit, and a clip transistor that fixes a potential of the one end to a predetermined value.

12. The solid-state image sensor according to claim 11, wherein
there are further disposed, on the light-receiving substrate, a first resistor that is inserted between one end of the first avalanche photodiode and the first selection transistor, and a second resistor that is inserted between one end of the second avalanche photodiode and the second selection transistor.

13. An imaging device comprising the solid-state image sensor according to claim 11.

14. A solid-state image sensor comprising:
a light-receiving substrate on which a plurality of avalanche photodiodes is disposed, each of the avalanche photodiodes generating a current corresponding to incidence of a photon;
a logic substrate on which a counter is disposed, the counter counting a number of the photons on a basis of the current of a selected avalanche photodiode among the plurality of avalanche photodiodes; and
an intermediate substrate, wherein
the plurality of avalanche photodiodes includes first and second avalanche photodiodes, and
there are further disposed, on the intermediate substrate, a first selection transistor that opens and closes a path between one end of the first avalanche photodiode and a common node, and a second selection transistor that opens and closes a path between one end of the second avalanche photodiode and the common node.

15. The solid-state image sensor according to claim 14, wherein
there is further disposed, on the logic substrate,
a detection circuit that generates a pulse signal on a basis of a potential of the common node and outputs the pulse signal to the counter, and
there is further disposed, on the intermediate substrate, a clip transistor that fixes a potential of the one end to a predetermined value.

16. The solid-state image sensor according to claim 14, wherein
there is further disposed, on the intermediate substrate, a detection circuit that generates a pulse signal on a basis of a potential of the common node and outputs the pulse signal to the counter.

17. The solid-state image sensor according to claim 14, wherein
there are further disposed, on the light-receiving substrate, a first resistor that is inserted between one end of the first avalanche photodiode and the first selection transistor, and a second resistor that is inserted between one end of the second avalanche photodiode and the second selection transistor.

18. The solid-state image sensor according to claim 17, wherein
there is further disposed, on the logic substrate,
a detection circuit that generates a pulse signal on a basis of a potential of the common node and outputs the pulse signal to the counter.

19. The solid-state image sensor according to claim 17, wherein
there is further disposed, on the intermediate substrate, a detection circuit that generates a pulse signal on a basis of a potential of the common node and outputs the pulse signal to the counter.

20. An imaging device comprising the solid-state image sensor according to claim 14.

\* \* \* \* \*